(12) United States Patent
Sugita

(10) Patent No.: US 7,183,950 B2
(45) Date of Patent: Feb. 27, 2007

(54) DATA COMPRESSION APPARATUS, AND DATA COMPRESSION PROGRAM STORAGE MEDIUM

(75) Inventor: Yukio Sugita, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 11/345,546

(22) Filed: Feb. 2, 2006

(65) Prior Publication Data

US 2006/0176196 A1    Aug. 10, 2006

(30) Foreign Application Priority Data

| Feb. 7, 2005 | (JP) | ............. 2005-030571 |
| Mar. 28, 2005 | (JP) | ............. 2005-091476 |
| Mar. 28, 2005 | (JP) | ............. 2005-091483 |

(51) Int. Cl.
    *H03M 7/30* (2006.01)
(52) U.S. Cl. .......................... 341/76; 341/50
(58) Field of Classification Search ............. 341/50–90
    See application file for complete search history.

(56) References Cited

U.S. PATENT DOCUMENTS 6,657,567 B2 * 12/2003 Koyanagi .................. 341/60
6,768,818 B2 * 7/2004 Friederich et al. ............ 341/55

FOREIGN PATENT DOCUMENTS

| JP | 5-328142 A | 12/1993 |
| JP | 9-200540 A | 7/1997 |
| JP | 10-164620 A | 6/1998 |
| JP | 2001-520822 A | 10/2001 |
| WO | WO 98/47234 A1 | 10/1998 |

* cited by examiner

*Primary Examiner*—Howard L. Williams
*Assistant Examiner*—Lam T. Mai
(74) *Attorney, Agent, or Firm*—Sughrue Mion, PLLC

(57) ABSTRACT

A data compression apparatus includes: a difference creating section that determines a difference between adjacent numerical values on continuity of numerical values constituting the data to be compressed so as to create new data to be compressed; an offset section wherein numerical values constituting the new data to be compressed consisting of the continued numerical values, which is created by the difference creating section, is subjected to an offset by a predetermined value; a divisional section that divides every numerical value of the data to be compressed, which is subjected to the offset by the offset section, into an upper significant digit bit portion and a lower significant digit bit portion; an upper significant data compression section that applies reversal compression processing to the upper significant digit data; and a lower significant data compression section that applies reversal compression processing to the lower significant digit data.

18 Claims, 21 Drawing Sheets

(A)

(B)

| 1~50 | 51~100 | 101~150 | 151~200 | 201~256 |
|---|---|---|---|---|
| 0000000000000011, 2 | 0000000010001001, 10 | 0000000001011011, 10 | 0000000000010101, 10 | 0000000000100111, 10 |
| 0000000000000011, 3 | 0000000010001000, 10 | 0000000001011010, 10 | 0000000000010100, 10 | 0000000000100110, 10 |
| 0000000000000010, 3 | 0000000010001011, 10 | 0000000001011001, 10 | 0000000000011111, 10 | 0000000000100001, 10 |
| 0000000000001010, 4 | 0000000010001010, 10 | 0000000001000100, 10 | 0000000000011110, 10 | 0000000000100000, 10 |
| 0000000000001001, 4 | 0000000010110101, 10 | 0000000001000111, 10 | 0000000000010001, 10 | 0000000000100011, 10 |
| 0000000000001000, 4 | 0000000010110100, 10 | 0000000001000110, 10 | 0000000000010000, 10 | 0000000000100010, 10 |
| 0000000000010110, 5 | 0000000010110111, 10 | 0000000001000001, 10 | 0000000000010011, 10 | 0000000000101101, 10 |
| 0000000000001111, 6 | 0000000010110110, 10 | 0000000001000000, 10 | 0000000000010010, 10 | 0000000000101100, 10 |
| 0000000000011101, 7 | 0000000010110001, 10 | 0000000001000011, 10 | 0000000000011101, 10 | 0000000000101111, 10 |
| 0000000010111000, 8 | 0000000010110000, 10 | 0000000001000010, 10 | 0000000000011100, 10 | 0000000000101110, 10 |
| 0000000010111110, 8 | 0000000010110011, 10 | 0000000001001101, 10 | 0000000000011111, 10 | 0000000000101001, 10 |
| 0000000101111111, 9 | 0000000010110010, 10 | 0000000001001100, 10 | 0000000000011110, 10 | 0000000000101000, 10 |
| 0000000101111110, 9 | 0000000010111101, 10 | 0000000001001111, 10 | 0000000000011001, 10 | 0000000000101011, 10 |
| 0000000101111001, 9 | 0000000010111100, 10 | 0000000001001110, 10 | 0000000000011000, 10 | 0000000000101010, 10 |
| 0000000101111000, 9 | 0000000010111111, 10 | 0000000001001001, 10 | 0000000000001011, 10 | 0000000011010101, 10 |
| 0000000101111011, 9 | 0000000010111110, 10 | 0000000001001000, 10 | 0000000000001010, 10 | 0000000011010100, 10 |
| 0000000101111010, 9 | 0000000010111001, 10 | 0000000001001011, 10 | 0000000000000101, 10 | 0000000011010111, 10 |
| 0000000101111101, 9 | 0000000010111000, 10 | 0000000001001010, 10 | 0000000000000100, 10 | 0000000011010110, 10 |
| 0000000101110100, 9 | 0000000010111011, 10 | 0000000001110101, 10 | 0000000000000111, 10 | 0000000011010001, 10 |
| 0000000101110111, 9 | 0000000010111010, 10 | 0000000001110100, 10 | 0000000000000110, 10 | 0000000011010000, 10 |
| 0000000101110110, 9 | 0000000010100101, 10 | 0000000001110111, 10 | 0000000000000001, 10 | 0000000011010011, 10 |
| 0000000101110011, 9 | 0000000010100100, 10 | 0000000001110110, 10 | 0000000000000000, 10 | 0000000011010010, 10 |
| 0000000010010101, 10 | 0000000010100111, 10 | 0000000001110001, 10 | 0000000000000011, 10 | 0000000011011101, 10 |
| 0000000010010100, 10 | 0000000010100110, 10 | 0000000001110000, 10 | 0000000000000010, 10 | 0000000011011100, 10 |
| 0000000010010111, 10 | 0000000010100001, 10 | 0000000001110011, 10 | 0000000000000101, 10 | 0000000011011111, 10 |
| 0000000010010110, 10 | 0000000010100000, 10 | 0000000001110010, 10 | 0000000000000100, 10 | 0000000011011110, 10 |
| 0000000010010001, 10 | 0000000010100011, 10 | 0000000001111101, 10 | 0000000000000111, 10 | 0000000011011001, 10 |
| 0000000010010000, 10 | 0000000010100010, 10 | 0000000001111100, 10 | 0000000000000110, 10 | 0000000011011000, 10 |
| 0000000010010011, 10 | 0000000010101101, 10 | 0000000001111111, 10 | 0000000000001001, 10 | 0000000011011011, 10 |
| 0000000010010010, 10 | 0000000010101100, 10 | 0000000001111110, 10 | 0000000000001000, 10 | 0000000011011010, 10 |
| 0000000010011101, 10 | 0000000010101111, 10 | 0000000001111001, 10 | 0000000000001011, 10 | 0000000011000101, 10 |
| 0000000010011100, 10 | 0000000010101110, 10 | 0000000001111000, 10 | 0000000000001010, 10 | 0000000011000100, 10 |
| 0000000010011111, 10 | 0000000010101001, 10 | 0000000001111011, 10 | 0000000000110101, 10 | 0000000011000111, 10 |
| 0000000010011110, 10 | 0000000010101000, 10 | 0000000001111010, 10 | 0000000000110100, 10 | 0000000011000110, 10 |
| 0000000010011001, 10 | 0000000010101011, 10 | 0000000001100100, 10 | 0000000000110111, 10 | 0000000011000001, 10 |
| 0000000010011000, 10 | 0000000010101010, 10 | 0000000001100111, 10 | 0000000000110110, 10 | 0000000011000000, 10 |
| 0000000010011011, 10 | 0000000001010101, 10 | 0000000001100110, 10 | 0000000000110001, 10 | 0000000011000011, 10 |
| 0000000010110100, 10 | 0000000001010100, 10 | 0000000001100001, 10 | 0000000000110000, 10 | 0000000011000010, 10 |
| 0000000010000101, 10 | 0000000001010111, 10 | 0000000001100000, 10 | 0000000000110011, 10 | 0000000011001101, 10 |
| 0000000010000100, 10 | 0000000001010110, 10 | 0000000001100011, 10 | 0000000000110010, 10 | 0000000011001100, 10 |
| 0000000010000111, 10 | 0000000001010001, 10 | 0000000001100010, 10 | 0000000000111101, 10 | 0000000011001111, 10 |
| 0000000010000110, 10 | 0000000001010000, 10 | 0000000001101101, 10 | 0000000000111100, 10 | 0000000011001110, 10 |
| 0000000010000001, 10 | 0000000001010011, 10 | 0000000001101100, 10 | 0000000000111111, 10 | 0000000011001001, 10 |
| 0000000010000000, 10 | 0000000001010010, 10 | 0000000001101111, 10 | 0000000000111110, 10 | 0000000011001000, 10 |
| 0000000010000011, 10 | 0000000001011101, 10 | 0000000001101110, 10 | 0000000000111001, 10 | 0000000011001011, 10 |
| 0000000010000010, 10 | 0000000001011100, 10 | 0000000001101001, 10 | 0000000000111000, 10 | 0000000011001010, 10 |
| 0000000010001101, 10 | 0000000001011111, 10 | 0000000001101000, 10 | 0000000000111011, 10 | 0000000011100101, 10 |
| 0000000010001100, 10 | 0000000001011110, 10 | 0000000001101011, 10 | 0000000000111010, 10 | 0000000011100100, 10 |
| 0000000010001111, 10 | 0000000001011001, 10 | 0000000001101010, 10 | 0000000000100101, 10 | 0000000011100111, 10 |
| 0000000010001110, 10 | 0000000001011000, 10 | 0000000001010100, 10 | 0000000000100100, 10 | 0000000011100110, 10 |
| | | | | 0000000011100001, 10 |
| | | | | 0000000011100000, 10 |
| | | | | 0000000011100011, 10 |
| | | | | 0000000011100010, 10 |
| | | | | 0000001011100101, 10 |
| | | | | 0000001011100100, 10 |

DATA COMPRESSION APPARATUS, AND DATA COMPRESSION PROGRAM STORAGE MEDIUM

BACKGROUND OF THE INVENTION

1. Field of the Invention

The present invention relates to a data compression apparatus for compressing data such as image data, and a data compression program storage medium storing a data compression program, which causes an information processing apparatus such as a computer to operate as the data compression apparatus.

2. Description of the Related Art

Hitherto, in order to reduce storage capacity or traffic, there is widely adopted a technology of compressing data such as image data.

For example, Japanese Patent Laid Open Gazette TokuKai Hei. 5-328142 discloses a technology as set forth below.

When a CLUT (color lookup table) is constructed through selection of a representative color from an original image, color numbers are allotted so that a series of color numbers has a closed value of color data, and then a bit map associated with the CLUT is created to determine a difference of color numbers between adjacent pixels. In the event that the difference takes a large value, the color number of the bit map is altered in such an extent that no deterioration of image quality occurs, so that the difference is biased to a small value, and a run length coding is applied to difference data.

Japanese Patent Laid Open Gazette TokuKai Hei. 10-164620 discloses a technology as set forth below.

Image data consisting of a plurality of data allotted to the associated colors is encoded on a non-reversible compression basis. One of the data is allotted to a transparent color, which is reversible. The image data comprises an immediate value (a first value in differential coding) and a plurality of differential values (a previous value in differential coding) subsequent to the immediate value. When those values are encoded on a non-reversible compression basis, the immediate value and the differential values representative of the transparent color are provided on a reversible basis. And the immediate value representative of the transparent color is expressed by an intermediate value of the data values for respective colors, or the differential values representative of the transparent color is expressed by "0".

Japanese Patent Document Tokuhyou No. 2001-5-20822 discloses a technology in which encoding is carried out by a difference between the predicted number (s' (j)) and the actual number (s (j)).

Japanese Patent Laid Open Gazette TokuKai Hei. 9-200540 discloses an image compression apparatus in which for Nth line of pixel data train, the state of distributions of the same pixel data in the sub-scanning direction is recognized, and the state of distributions of the same pixel data in the main scanning direction is recognized, so that it is decided in accordance with the results of those recognition whether the same pixel data continued in the sub-scanning direction are to be subjected to a compression processing, or the same pixel data continued in the main scanning direction are to be subjected to a compression processing.

Here, there will be explained a system to which a data compression technology is applied.

FIG. 1 is a view useful for understanding an example of a print system to which a data compression technology is applied. FIG. 2 is a view useful for understanding a data processing in the print system.

As shown in FIG. 1, the print system comprises a host controller 100, an interface equipment 200, and a printer 300. The host controller 100 is connected to the interface equipment 200 via an all-purpose interface cable 150 such as SCSI. And the interface equipment 200 is connected to the printer 300 via a dedicated interface cable 250.

In the host controller 100, as shown in FIG. 2, data 11 of images and characters described in various languages and formats, such as PDF, PS, TIFF, are divided into image (CT; Continuous Tone) data and characters and lines (LW; Line Work) data, and RIP (Raster Image Processing) is applied to such two types of data, so that bit map data 12A and 13A are created. Further, data compression processing is applied to such two types of data, so that non-reversible compressed data 14 is created on the CT and reversible compressed data 15 is created on the LW. Those types of compressed data 14 and 15 are transmitted from the host controller 100 via the all-purpose interface cable 150 shown in FIG. 1 to the interface equipment 200. The interface equipment 200 applies a data expansion processing to the transmitted compressed data 14 and 15 to creates bit map data 12B and 13B associated with the bit map data 12A and 13A, respectively, which are in the state before an application of the data compression processing by the host controller 100. With respect to the CT data, when the host controller 100 performs the data compression, the non-reversible compression processing is carried out. Accordingly, it is difficult to completely return the CI data after the data expansion, or the bit map data 12B to the CI data before the data compression, or the bit map data 12A. However, it is possible to reproduce the substantially same bit map data. With respect to the LW data, when the host controller 100 performs the data compression, the reversible compression processing is carried out. Accordingly, it is possible to restore the LW data after the data expansion, or the bit map data 13B to the LW data before the data compression, or the bit map data 13A.

The interface equipment 200 synthesizes the CI data after the data expansion or the bit map data 12B with the LW data after the data expansion or the bit map data 13B, and transmits the synthesized data to the printer 300 together with halftone dot information and the like in form of a tag. The printer 300 prints out an image in accordance with the bit map data received from the interface equipment 200 and the attached tag information.

In the event that there is a need that the host controller 100 and the interface equipment 200 are individually constructed in form of a separated apparatus, for example, in a case where the host controller 100 and the interface equipment 200 are mutually isolated, and in case of a system in which the interface equipment 200 receives image data from a plurality of host controllers, as shown in FIG. 2, there is provided such an arrangement that data is transferred to the interface equipment 200 through data compression by the host controller 100, so that the interface equipment 200 performs data expansion. This arrangement makes it possible to reduce a transfer time of the data from the host controller 100 to the interface equipment 200, and thereby improving the productivity of the print.

Generally, with respect to the CT data, there is adopted a compression system such as JPEG, which is high in compressibility, while it is non-reversible. On the other hand, with respect to the LW data, there is adopted a reversible compression system such as PackBits.

However, the compression system such as JPEG takes much time for compression processing in software. This causes a processing ability of a system of compression processing to be deteriorated in its entirety.

While the compression system such as JPEG necessarily involves deterioration of an image quality because of the non-reversible compression processing, recently, a demand for higher image quality is more enhanced, and thus it is considered that a reversible compression also for CT data is performed not so as to involve deterioration of an image quality.

SUMMARY OF THE INVENTION

In view of the foregoing, it is an object of the present invention to provide a data compression apparatus capable of performing a data compression processing applicable to compression of CT data, and a data compression program storage medium storing a data compression program, which causes an information processing apparatus such as a computer to operate as the data compression apparatus capable of performing a data compression processing applicable to compression of CT data.

To achieve the above-mentioned object, the present invention provides a data compression apparatus that applies a data compression processing to data to be compressed, the data consisting of continued numerical values represented by a predetermined number of unit bits, the data compression apparatus comprising:

a difference creating section that determines a difference between adjacent numerical values on continuity of numerical values constituting the data to be compressed so as to create new data to be compressed consisting of continued numerical values representative of the difference;

an offset section wherein numerical values constituting the new data to be compressed consisting of the continued numerical values, which is created by the difference creating section, is subjected to an offset by a predetermined value;

a divisional section that divides every numerical value of the data to be compressed, which is subjected to the offset by the offset section, into an upper significant digit bit portion and a lower significant digit bit portion at a predetermined divisional bit number less than the predetermined number of unit bits, so that the data to compressed is divided into upper significant digit data consisting of continuity of numerical values of the upper significant digit bit portion and lower significant digit data consisting of continuity of numerical values of lower significant digit bit portion;

an upper significant data compression section that applies reversal compression processing to the upper significant digit data divided by the divisional section; and a lower significant data compression section that applies reversal compression processing to the lower significant digit data divided by the divisional section.

As to the meaning of "adjacent" appearing on the phrase "determines a difference between adjacent numerical values on continuity of numerical values constituting the data to be compressed", it is acceptable to be adjacent on a data stream, but it is not restricted to this meaning. For example, in the event that two-dimensional image data is treated as one-dimensional stream of data, it is acceptable to be adjacent on a two-dimensional image. The same thing can be said of the following.

In the data compression apparatus according to the present invention as mentioned above, it is preferable that the upper significant data compression section includes a first coding section that outputs directly numerical values excepting a predetermined compression object numerical value of one or plural compression object numerical values, of the upper significant digit data, and outputs compression object numerical values through encoding into the compression object numerical values and numerical values representative of the continued number of the compression object numerical values identical with the compression object numerical values.

In the data compression apparatus according to the present invention as mentioned above, it is preferable that the upper significant data compression section comprises:

a first coding section that outputs directly numerical values excepting a predetermined compression object numerical value of one or plural compression object numerical values, of the upper significant digit data, and outputs compression object numerical values through encoding into the compression object numerical values and numerical values representative of the continued number of the compression object numerical values identical with the compression object numerical values; and a second coding section that applies entropy coding to data subjected to encoding by the first coding section, using a table for associating codes with numerical values.

In the data compression apparatus according to the present invention as mentioned above, it is acceptable that the upper significant data compression section comprises:

a first coding section that outputs directly numerical values excepting a predetermined compression object numerical value of one or plural compression object numerical values, of the upper significant digit data, and outputs compression object numerical values through encoding into the compression object numerical values and numerical values representative of the continued number of the compression object numerical values identical with the compression object numerical values; and a second coding section that applies Huffman coding to data subjected to encoding by the first coding section, using a Huffman table.

In the data compression apparatus according to the present invention it is preferable that the upper significant data compression section comprises:

a first coding section that outputs directly numerical values excepting a predetermined compression object numerical value of one or plural compression object numerical values, of the upper significant digit data, and outputs compression object numerical values through encoding into the compression object numerical values and numerical values representative of the continued number of the compression object numerical values identical with the compression object numerical values;

a histogram computing section that determines a histogram of numeral values appearing on the data subjected to encoding by the first coding section;

a code allocation section that allots to a table for associating codes with numerical values the shorter code in code length, as occurrence frequency is higher in numerical number, in accordance with the histogram determined in the histogram computing section; and a second coding section that applies entropy coding to data subjected to encoding by the first coding section, using a table in which codes are allotted in the code allocation section.

In the data compression apparatus according to the present invention, it is preferable that the lower significant data compression section applies entropy coding to the lower significant data, using a table for associating codes with numerical values.

In the data compression apparatus according to the present invention as mentioned above, it is acceptable that the lower significant data compression section applies Huffman coding to the lower significant data, using a Huffman table.

In the data compression apparatus according to the present invention as mentioned above, it is preferable that the lower significant data compression section comprises:

an upper significant data compression section that applies reversible compression processing to the upper significant digit data divided by the divisional section, and applies reversible compression processing, including coding processing for applying entropy coding using a table for associating codes with numerical values, to the lower significant digit data divided by the divisional section; and an allocation section that allots to the table, prior to the reversible compression processing by the lower significant data compression section, the shorter code in code length, as occurrence frequency is higher in numerical number of the data to be compressed, to which entropy coding is applied.

In the data compression apparatus according to the present invention as mentioned above, it is acceptable that the lower significant data compression section performs, as the coding processing, coding processing for applying Huffman coding, using a Huffman table, and the allocation section allots codes to the Huffman table of the lower significant data compression section.

In the data compression apparatus according to the present invention as mentioned above, it is preferable that the allocation section determines the occurrence frequency through analysis of numerical values corresponding to a part of an image, of compressed data representative of the image.

In the data compression apparatus according to the present invention, it is preferable that the allocation section creates analyzing data through applying same processing as that of the difference creating section, the offset section, and the divisional section to the numerical values corresponding to a part of an image, of compressed data representative of the image, and determines the occurrence frequency through analyzing the analyzing data.

In the data compression apparatus according to the present invention as mentioned above, it is preferable that the upper significant data compression section applies reversible compression processing, including coding processing for applying entropy coding using a table for associating codes with numerical values, to the upper significant digit data divided by the divisional section, the allocation section determines occurrence frequencies of numerical values on compressed data of the upper significant data compression section and the lower significant data compression section through analysis of numerical values corresponding to a part of an image, of the compressed data representative of the image, and the allocation section allots to the table of each of the upper significant data compression section and the lower significant data compression section the shorter code in code length, as occurrence frequency is higher in numerical number of the data to be compressed, in accordance with the occurrence frequencies.

In the data compression apparatus according to the present invention as mentioned above, it is preferable that the upper significant data compression section applies reversible compression processing, including coding processing for applying entropy coding using a table for associating codes with numerical values, to the upper significant digit data divided by the divisional section, the allocation section creates analyzing data through applying same processing as that of the difference creating section, the offset section, and the divisional section to the numerical values corresponding to a part of an image, of compressed data representative of the image, and determines occurrence frequencies of numerical values on compressed data of the upper significant data compression section and the lower significant data compression section through analyzing the analyzing data, and the allocation section allots to the table of each of the upper significant data compression section and the lower significant data compression section the shorter code in code length, as occurrence frequency is higher in numerical number of the data to be compressed, in accordance with the occurrence frequencies.

In the data compression apparatus according to the present invention as mentioned above, it is acceptable that the upper significant data compression section performs, as the coding processing, coding processing for applying Huffman coding, using a Huffman table, and the allocation section allots codes to the Huffman table of the upper significant data compression section.

In the data compression apparatus according to the present invention as mentioned above, it is preferable that the upper significant data compression section performs, as the coding processing, coding processing for applying Huffman coding, using a Huffman table, and the allocation section allots codes to the Huffman table of the upper significant data compression section.

In the data compression apparatus according to the present invention as mentioned above, it is preferable that the lower significant data compression section receives an instruction of compression omission to output the lower significant data with non-compression.

In the data compression apparatus according to the present invention as mentioned above, it is preferable that the data compression apparatus further comprises a two-dimensional creating section that determines a two-dimensional difference on numerical values constituting compressed data in accordance with a plurality of numerical values adjacent to the numerical values in a plurality of directions looking on the image so that there is created image data consisting of continuity of numerical values representative of the two-dimensional difference.

To achieve the above-mentioned object, the present invention provides a data compression program storage medium storing a data compression program, which causes an information processing apparatus to operate as a data compression apparatus that applies a data compression processing to data to be compressed, the data consisting of continued numerical values represented by a predetermined number of unit bits, the data compression apparatus comprising:

a difference creating section that determines a difference between adjacent numerical values on continuity of numerical values constituting the data to be compressed so as to create new data to be compressed consisting of continued numerical values representative of the difference;

an offset section wherein numerical values constituting the new data to be compressed consisting of the continued numerical values, which is created by the difference creating section, is subjected to an offset by a predetermined value;

a divisional section that divides every numerical value of the data to be compressed, which is subjected to the offset by the offset section, into an upper significant digit bit portion and a lower significant digit bit portion at a predetermined divisional bit number less than the predetermined number of unit bits, so that the data to compressed is divided into upper significant digit data consisting of continuity of numerical values of the upper significant digit bit portion and lower significant digit data consisting of continuity of numerical values of lower significant digit bit portion;

an upper significant data compression section that applies reversal compression processing to the upper significant digit data divided by the divisional section; and a lower significant data compression section that applies reversal compression processing to the lower significant digit data divided by the divisional section.

The data compression program stored in the data compression program storage medium includes all the aspects corresponding to those of the data compression apparatus.

With respect to the structural elements such as the difference creating section constituting the data compression program related to the present invention, it is acceptable that function of one structural element is implemented by one program part, function of one structural element is implemented by a plurality of program parts, or alternatively functions of a plurality of structural elements are implemented by one program part. Further, it is acceptable that those structural elements are executed by oneself or by instruction to another program or program parts incorporated into a computer.

BRIEF DESCRIPTION OF THE DRAWINGS

FIG. 21 is a view showing an example of a code train, which is prepared in the Huffman table.

FIG. 22 is a view showing another example of a code train, which is prepared in the Huffman table.

DETAILED DESCRIPTION OF PREFERRED EMBODIMENTS

Embodiments of the present invention will be described with reference to the accompanying drawings.

Figure 1:
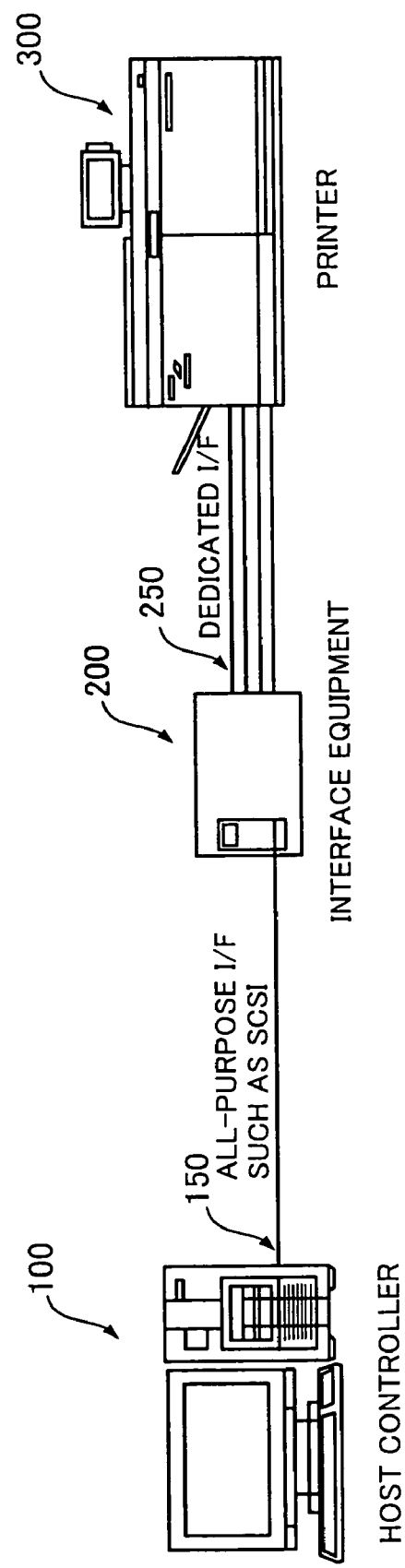
FIG. 1 is a view useful for understanding an example of a print system to which a data compression technology is applied.
Figure 2:
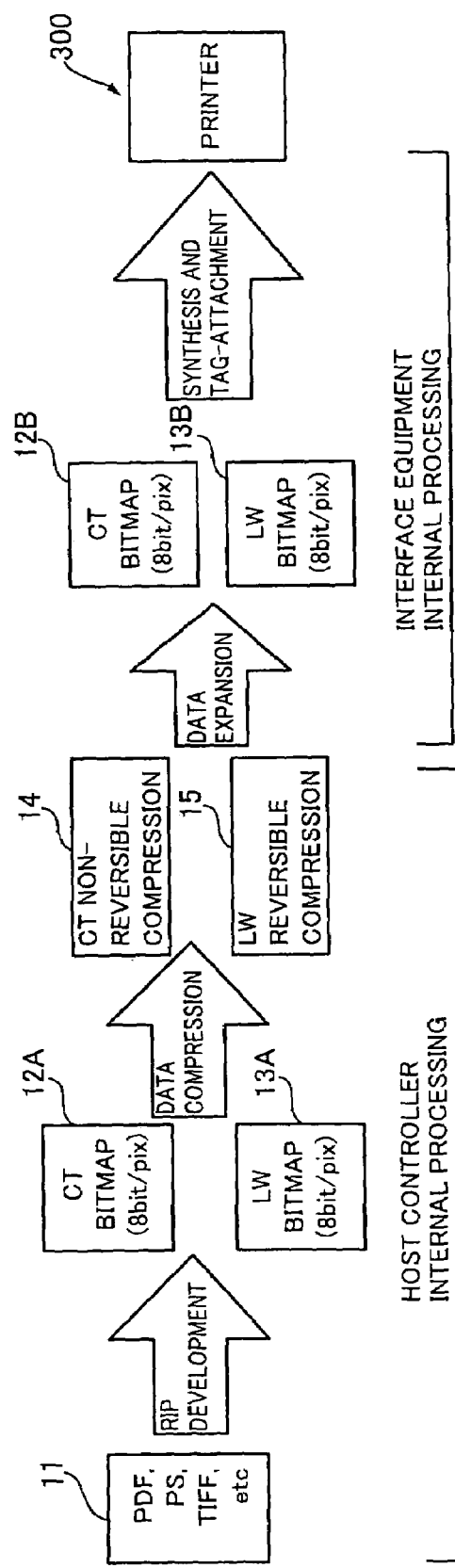
FIG. 2 is a view useful for understanding a data processing in the print system.

The embodiments of the present invention relate to an image compression apparatus that is to be incorporated into the host controller 100 of the overall system shown in FIG. 1. More specifically, the image compression apparatus performs a data compression for bit map data 12A (FIG. 2) of CT in the host controller. Accordingly, it is understood that the data compression processing on the CT data, which was explained referring to FIG. 1 and FIG. 2, is replaced by data compression processing according to the embodiments of the present invention, which will be explained herein after, and also it is understood that the data expansion (thawing) processing in the interface equipment is replaced by data expansion (thawing) processing associated with the data compression processing according to the embodiments of the present invention. Thus the redundant explanations on the overall system shown in FIG. 1 and the flow of the processing shown in FIG. 2 will be omitted.

Figure 3:
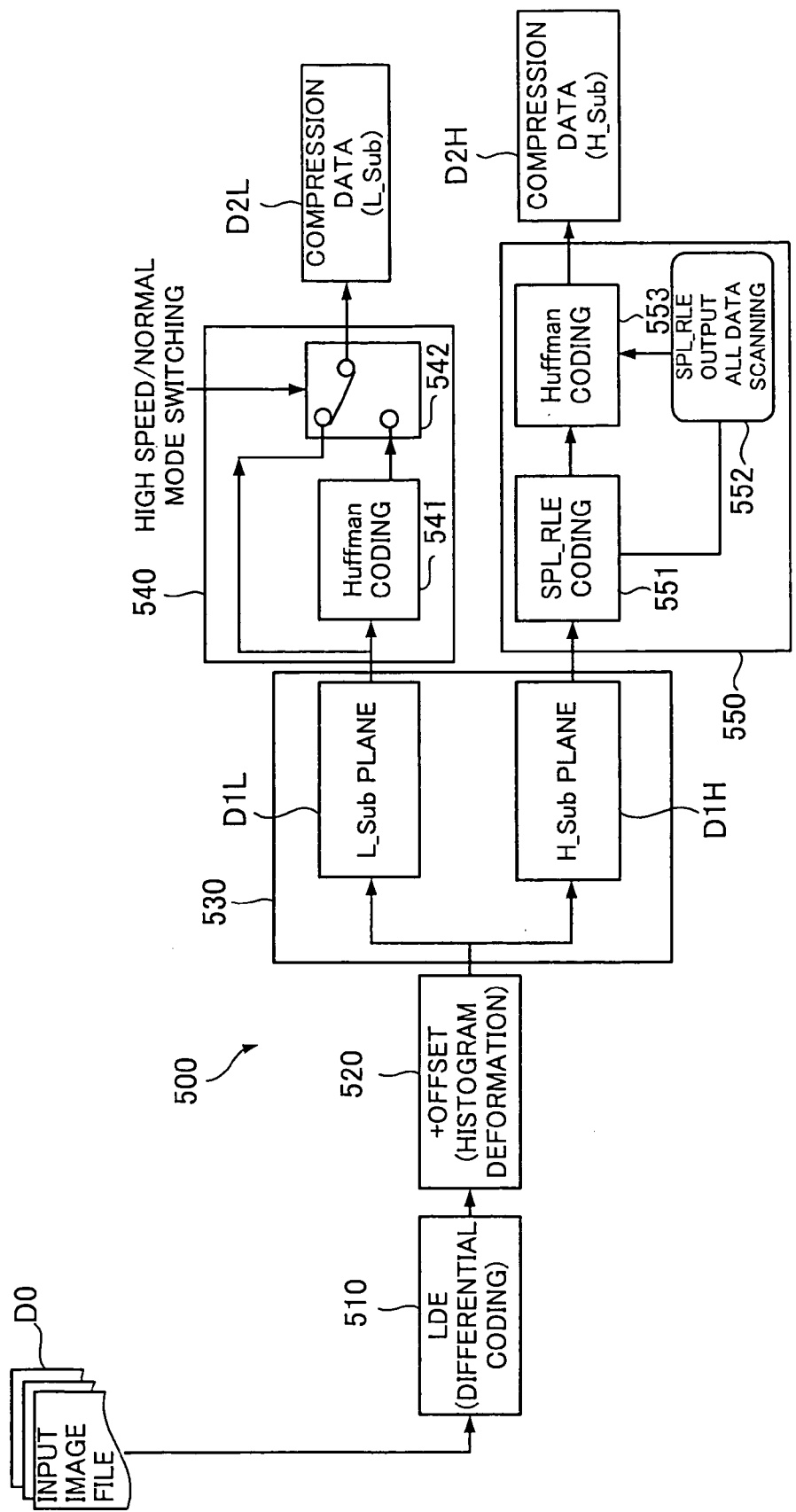
FIG. 3 is a block diagram of an image compression apparatus corresponding to a first embodiment of a data compression apparatus of the present invention.

FIG. 3 is a block diagram of an image compression apparatus corresponding to a first embodiment of a data compression apparatus of the present invention.

An image compression apparatus 500 shown in FIG. 3 comprises a differential coding section 510, an offset section 520, a plane divisional section 530, an L plane compression section 540, and an H plane compression section 550. Details of the respective sections 510 to 550 will be described later. Hereinafter, a flow of image data in the image compression apparatus 500 will be described.

An input image file D0 (according to the present embodiment, it corresponds to a file storing the CT data 12A, which is developed into a bit map, as shown in FIG. 2), is inputted to the differential coding section 510 of the image compression apparatus 500 shown in FIG. 3 to perform the differential coding processing, that is, such a processing that there is determined a difference between adjacent numerical values on the continuity of numerical values constituting entered data so as to create image data consisting of the continued numerical values of 8 bits representative of the difference. The differential coding section 510 corresponds to an example of the difference creating section referred to in the present invention.

The image data consisting of a series of numerical values representative of a difference, which is created by the differential coding section 510, is fed to the offset section 520 so as to be subjected to the offset by a predetermined value. Thereafter, the plane divisional section 530 divides every numerical value of 8 bits of the image data into lower significant digit 4 bits and upper significant digit 4 bits, so that the image data is divided into a lower significant digit sub plane D1L consisting of a series of numerical values of lower significant digit 4 bits and an upper significant digit sub plane D1H consisting of a series of numerical values of upper significant digit 4 bits. The offset section 520 corresponds to an example of the offset section referred to in the present invention. The plane divisional section 530 corresponds to an example of the divisional section referred to in the present invention. The lower significant digit sub plane D1L and the upper significant digit sub plane D1H correspond to examples of the lower significant digit data and the upper significant digit data referred to in the present invention, respectively.

The lower significant digit sub plane D1L and the upper significant digit sub plane D1H, which are divided by the plane divisional section 530, are fed to the L plane compression section 540 and the H plane compression section 550, respectively so as to be subjected to the reversible compression. The L plane compression section 540 and the H plane compression section 550 correspond to the lower significant digit data compression section and the upper significant digit data compression section referred to in the present invention, respectively.

A Huffman coding section 541 of the L plane compression section 540 performs coding processing in which numerical values constituting the lower significant digit sub plane D1L fed to the Huffman coding section 541 are replaced by codes according to a Huffman table for associating the numerical values with the codes in accordance with the Huffman table. The Huffman coding is a sort of entropy coding. The L plane compression section 540 incorporates therein a mode switching section 542. The mode switching section 542 performs mode switching between a normal mode involving the Huffman coding by the Huffman coding section 541 and a high speed mode involving no Huffman coding to directly output the lower significant digit sub plane D1L in accordance with a user's instruction. The L plane compression section 540 outputs lower significant digit compressed data D2L in which the lower significant digit sub plane D1L is compressed. However, in case of the high speed mode, the lower significant digit compressed data D2L is the lower significant digit sub plane D1L per se.

On the other hand, the H plane compression section 550 comprises a run length coding section 551, a data scanning section 552, and a Huffman coding section 553. The upper significant digit sub plane D1H is fed to the run length coding section 551.

The run length coding section 551 detects, first, from among data of the received upper significant digit sub plane D1H, the existence of one or plural compression object numerical values and the continued number of the same compression object numerical values. Next, upon receipt of the detection result, the run length coding section 551 performs such a coding processing that data of the upper significant digit sub plane D1H, numerical values excepting the compression object numerical values are directly outputted, and the compression object numerical values are outputted through encoding into the compression object numerical values and numerical values representative of the continued number of the compression object numerical values identical with the compression object numerical values. The run length coding section 551 performs the coding processing in such a way that the continued number of the same compression object numerical values is expressed by different bit number in accordance with the continued number. More specifically, the run length coding section 551 performs the coding processing in such a way that when the continued number of the same compression object numerical values is not above than a predetermined value, the continued number is expressed by one-unit bit number, and when the continued number of the same compression object numerical values is above than the predetermined value, the continued number is expressed by two-unit bit number. According to the present embodiment, the run length coding section 551 corresponds to an example of the first coding section referred to the present invention.

The data, which is subjected to encoding by the run length coding section 551, is fed to both a data scanning section 552 and a Huffman coding section 553. The data scanning section 552 scans all the data, which is subjected to encoding by the run length coding section 551, so as to determine an occurrence frequency (histogram) of all numerical values appearing on the data. According to the present embodiment, the processing of determining the occurrence frequency is carried out on each of the data of the upper significant digit sub plane D1H shown in FIG. 3 on a unit basis so as to determine an occurrence frequency (histogram) of all numerical values appearing on the data, which is subjected to encoding by the run length coding section 551, of the data of the upper significant digit sub plane D1H. The data scanning section 552 allots to the Huffman table the shorter code in code length, as the occurrence frequency is higher in numerical number, in accordance with the determined data histogram (the occurrence frequency of the numerical number). The data scanning section 552 corresponds to one including an example of the histogram computing section and an example of the code allotting section referred to in the present invention.

The Huffman table, in which a code is allotted to a numerical value by the data scanning section 552, is transferred to the Huffman coding section 553. Upon receipt of the Huffman table, the Huffman coding section 553 performs coding processing in which numerical values constituting data fed to the Huffman coding section 553 are replaced by codes according to the Huffman table, that is, the shorter code in bit length, as the occurrence frequency is higher in numerical number. The Huffman coding section 553 corresponds to an example of the second coding section referred to in the present invention.

Data, which is subjected to the Huffman coding by the Huffman coding section 553, is accompanied with compression information including an allocation table for numerical values and codes allocated in the data scanning section 552, and then be outputted from the H plane compression section 550 in form of an upper significant digit compressed data D2H in which the upper significant digit sub plane D1H is compressed.

Thus, a set of the lower significant digit compressed data D2L and the upper significant digit compressed data D2H, which are outputted from the L plane compression section 540 and the H plane compression section 550, respectively, constitutes reversible compressed data in which the original image data is reversibly compressed. The reversible compressed data is transferred via an all-purpose interface 150 such as SCSI, as shown in FIG. 1, to the interface equipment 200. The interface equipment 200 applies a data expansion processing to the received reversible compressed data. In the data expansion processing, there is performed decoding processing for the associated coding processing explained in conjunction with FIG. 3, so that the same image data as the image data in the original input image file is restored to the original state.

Figure 4:
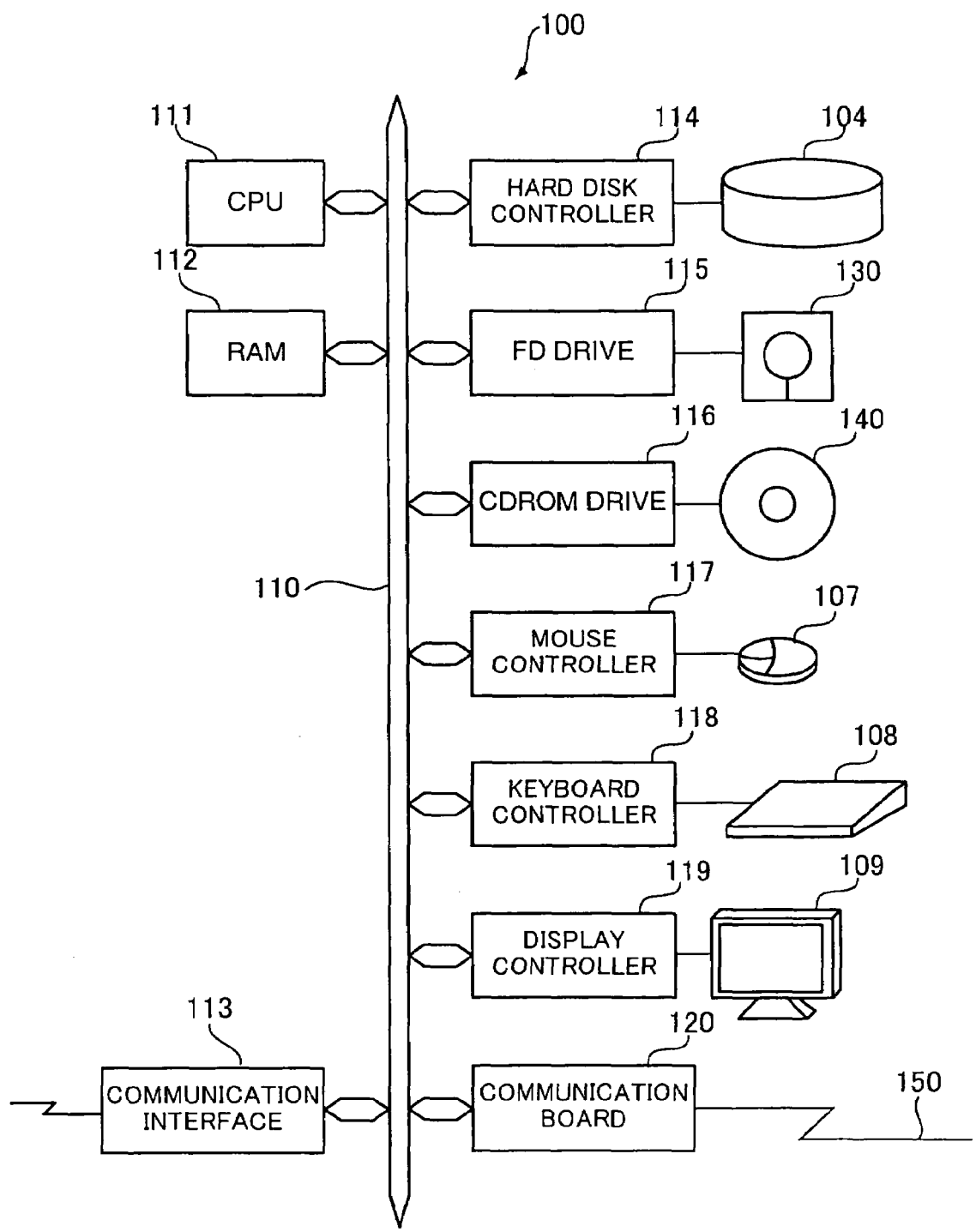
FIG. 4 is a hardware structural view of the host controller shown in FIG. 1.

FIG. 4 is a hardware structural view of the host controller shown in FIG. 1.

A host controller 100 shown in FIG. 1 may be constructed of a computer system of the structure shown in FIG. 4.

The host controller 100, which is constructed of the computer system shown in FIG. 4, comprises a CPU 111, a RAM 112, a communication interface 113, a hard disk controller 114, a flexible disk (FD) drive 115, a CD-ROM drive 116, a mouse controller 117, a keyboard controller 118, a display controller 119, and a communication board 120. These various types of elements are connected via a bus 110 to one another.

The hard disk controller 114 controls an access of a hard disk 104 that is incorporated in the host controller 100. The FD drive 115 and the CD-ROM drive 116 control an access of a flexible disk (FD) 130 and a CD-ROM 140, which are detachably mounted on the host controller 100, respectively. The mouse controller 117 and the keyboard controller 118 serve to detect operations of a mouse 107 and a keyboard 108, respectively, so that a result of the detection is transmitted to the CPU 111. The display controller 119 causes an image to be displayed on a display screen of a display 109 of the host controller 100 in accordance with the instruction of the CPU 111.

The communication board 120 has a function of a communication based on an all-purpose interface protocol such as SCSI, and serves to transmit the compressed image data via the interface cable 150 to the interface equipment 200 (cf. FIG. 1).

The communication interface 113 serves to perform a communication via all-purpose network such as Internet. The host controller 100 receives image data via the communication interface 113.

The RAM 112 reads a program stored in the hard disk 104 to develop the program for the purpose of execution by the CPU 111. The CPU 111 reads the program developed in the RAM 112 and executes the same.

Figure 5:
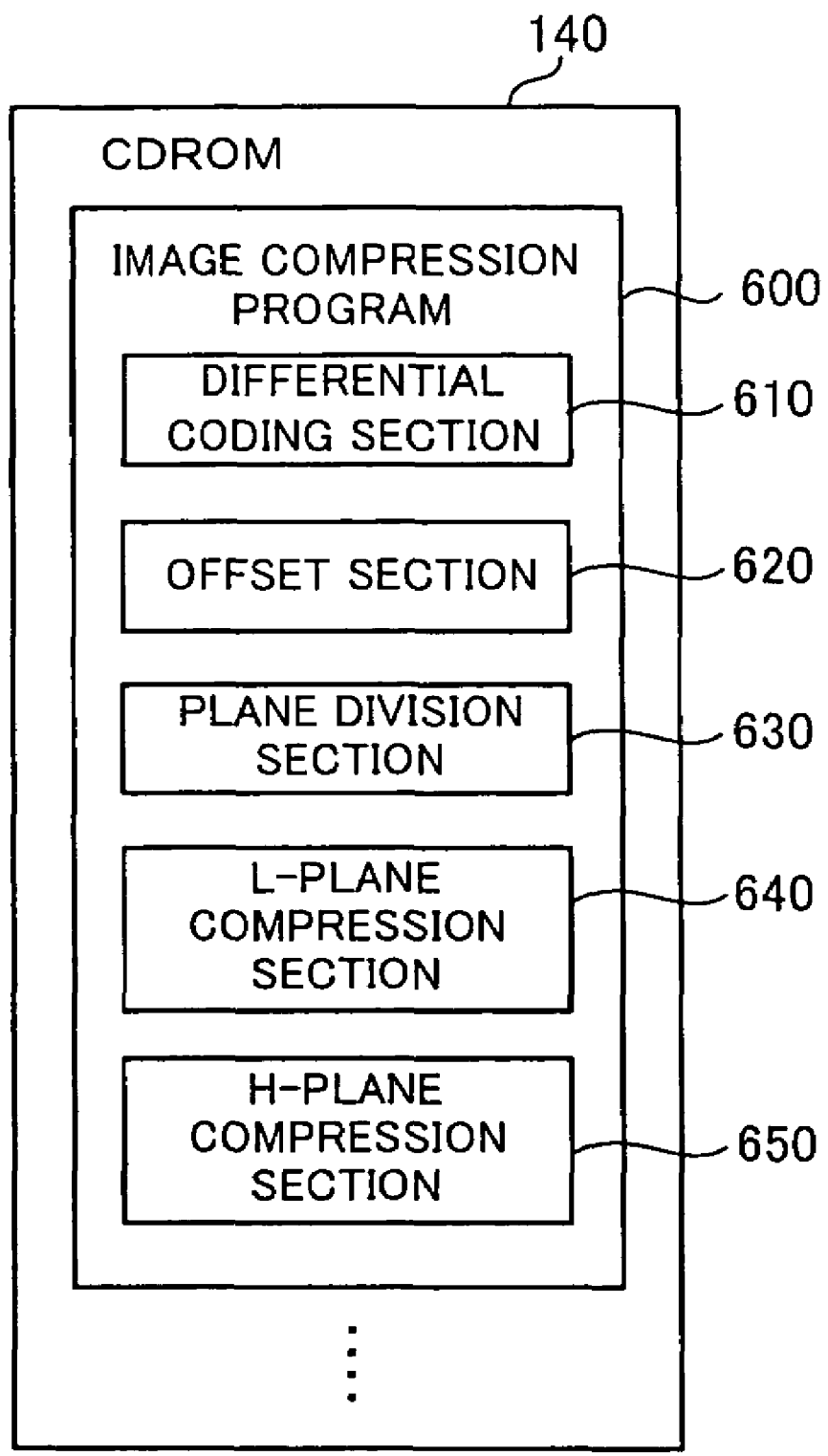
FIG. 5 is a typical structural view of an image compression processing program corresponding to a first embodiment of a data compression program stored in a data compression program storage medium of the present invention.

FIG. 5 is a typical structural view of an image compression processing program corresponding to a first embodiment of a data compression program stored in a data compression program storage medium of the present invention.

An image compression program 600 is stored in the CD-ROM 140.

The image compression program 600 comprises a differential coding section 610, an offset section 620, a plane divisional section 630, an L plane compression section 640, and an H plane compression section 650. The CD-ROM 140 stores therein various sorts of programs for executing a series of processing in the host controller 100 shown in FIG. 1, as well as the data compression program 600. Those programs are the same as the conventional one, and thus the redundant explanation will be omitted.

When the CD-ROM 140 shown in FIG. 5 is mounted on the host controller 100 shown in FIG. 4 so as to be accessed by the CD-ROM drive 116, the image compression program 600 stored in the CD-ROM 140 is up-loaded on the host controller 100 and is stored in the hard disk 104. Thus, the image compression program 600 stored in the hard disk 104 is read from the hard disk 104 and is developed in the RAM 112. When the CPU 111 executes the developed image compression program, the host controller 100 operates as an apparatus for executing various sorts of processing as the host controller, including processing as the image compression apparatus 500 shown in FIG. 3.

Here, when the image compression program 600 shown in FIG. 5 is installed in the host controller 100 and is executed in the CPU 111, the image compression program 600 implements the image compression apparatus 500 shown in FIG. 3 in the host controller 100. When the CPU 111 executes the differential coding section 610, the offset section 620, the plane divisional section 630, the L plane compression section 640, and the H plane compression section 650, those sections serve as program parts that cause the host controller 100 to operate as the differential coding section 510, the offset section 520, the plane divisional section 530, the L plane compression section 540, and the H plane compression section 550, respectively, which constitute the image compression apparatus 500 shown in FIG. 3. That is, those program parts make it possible to substantially constitute the structural elements of the image compression apparatus 500 on the host controller 100.

Functions of the sections 610 to 650 that constitute the image compression program 600 shown in FIG. 5, wherein those sections 610 to 650 are executed in the CPU 111, are the completely same as functions of the sections 510 to 550 that constitute the image compression apparatus 500 shown in FIG. 3, respectively. Accordingly, the above-mentioned explanation as to the image compression apparatus 500 shown in FIG. 3 and the detailed explanation, which will be described later, may serve as the explanation for the sections 610 to 650 that constitute the image compression program 600 shown in FIG. 5.

Figure 6:
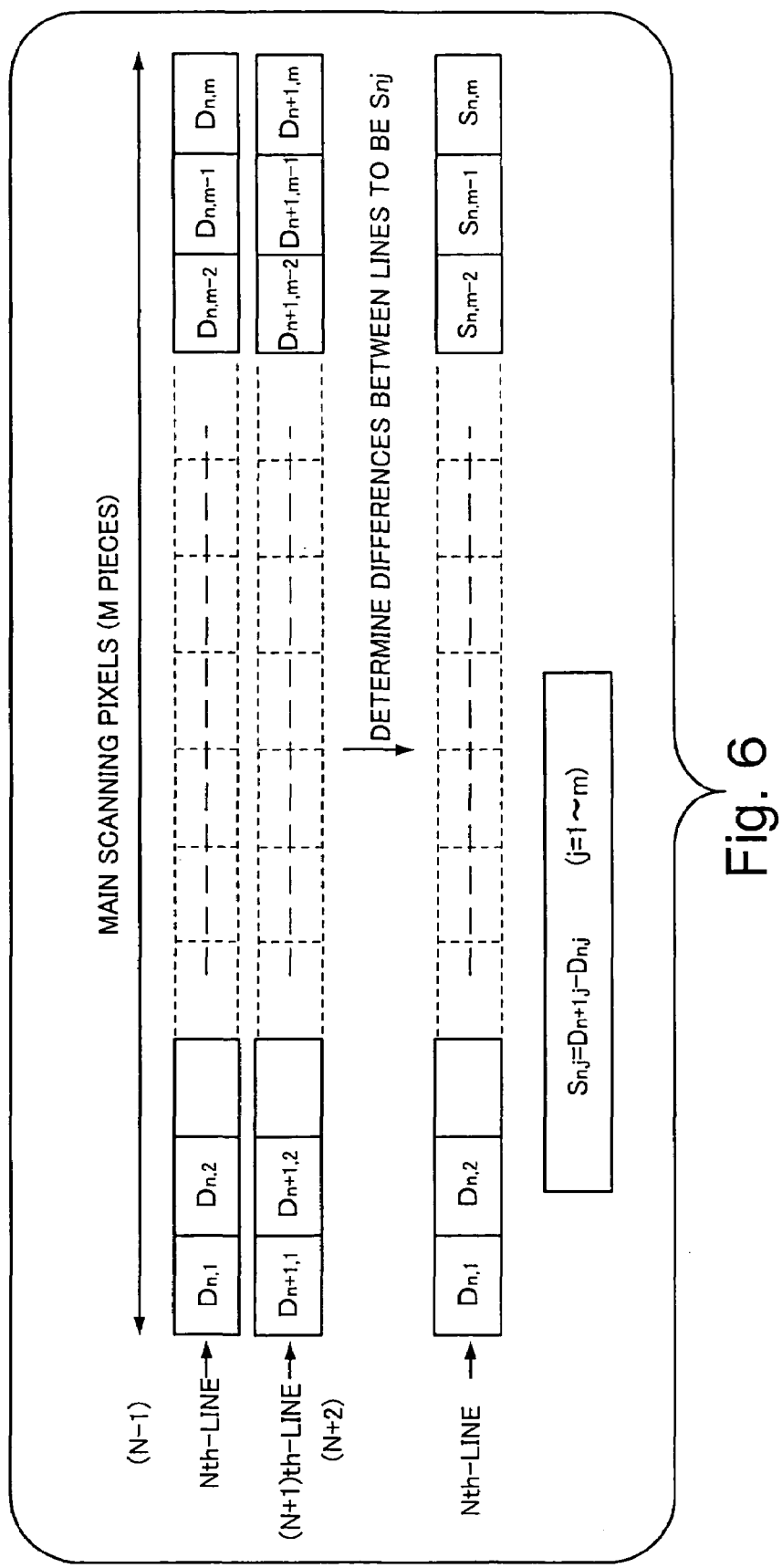
FIG. 6 is a view useful for understanding a data structure of image data of an input image file to be entered into the image compression apparatus shown in FIG. 3 and a concept of the differential coding.

FIG. 6 is a view useful for understanding a data structure of image data of an input image file to be entered into the image compression apparatus shown in FIG. 3 and a concept of the differential coding.

As shown in FIG. 6, the image data, which is to be entered to the image compression apparatus 500 shown in FIG. 3, consists of M pieces of pixels arranged in a predetermined main scanning direction. On the Nth line in the sub-scanning direction perpendicular to the main scanning direction, the pixel values of the pixels arranged in the main scanning direction are expressed, in the order of the arrangement, as set forth below.

$$D_{n,1}, D_{n,2}, \ldots, D_{n,m-2}, D_{n,m-1}, D_{n,m}$$

In a similar fashion, on the (N+1)th line in the sub-scanning direction, the pixel values of the pixels arranged in the main scanning direction are expressed, in the order of the arrangement, as set forth below.

$$D_{n+1,1}, D_{n+1,2}, \ldots, D_{n+1,m-2}, D_{n+1,m-1}, D_{n+1,m}$$

The differential coding section 510 of the image compression apparatus 500 shown in FIG. 3 receives the image data as mentioned above and determines the differences between the adjacent pixels. That is, the difference $S_{n,j}$ is expressed as follows.

$$S_{n,j} = D_{n+1,j} - D_{n,j} \quad (j=1-m)$$

Where $S_{n,j}$ denotes a difference between the Nth line and the (N+1)th line, and also the difference of the j-th pixel arranged in the main scanning direction.

Hereinafter, the differential operation will be explained in details.

Figure 7:
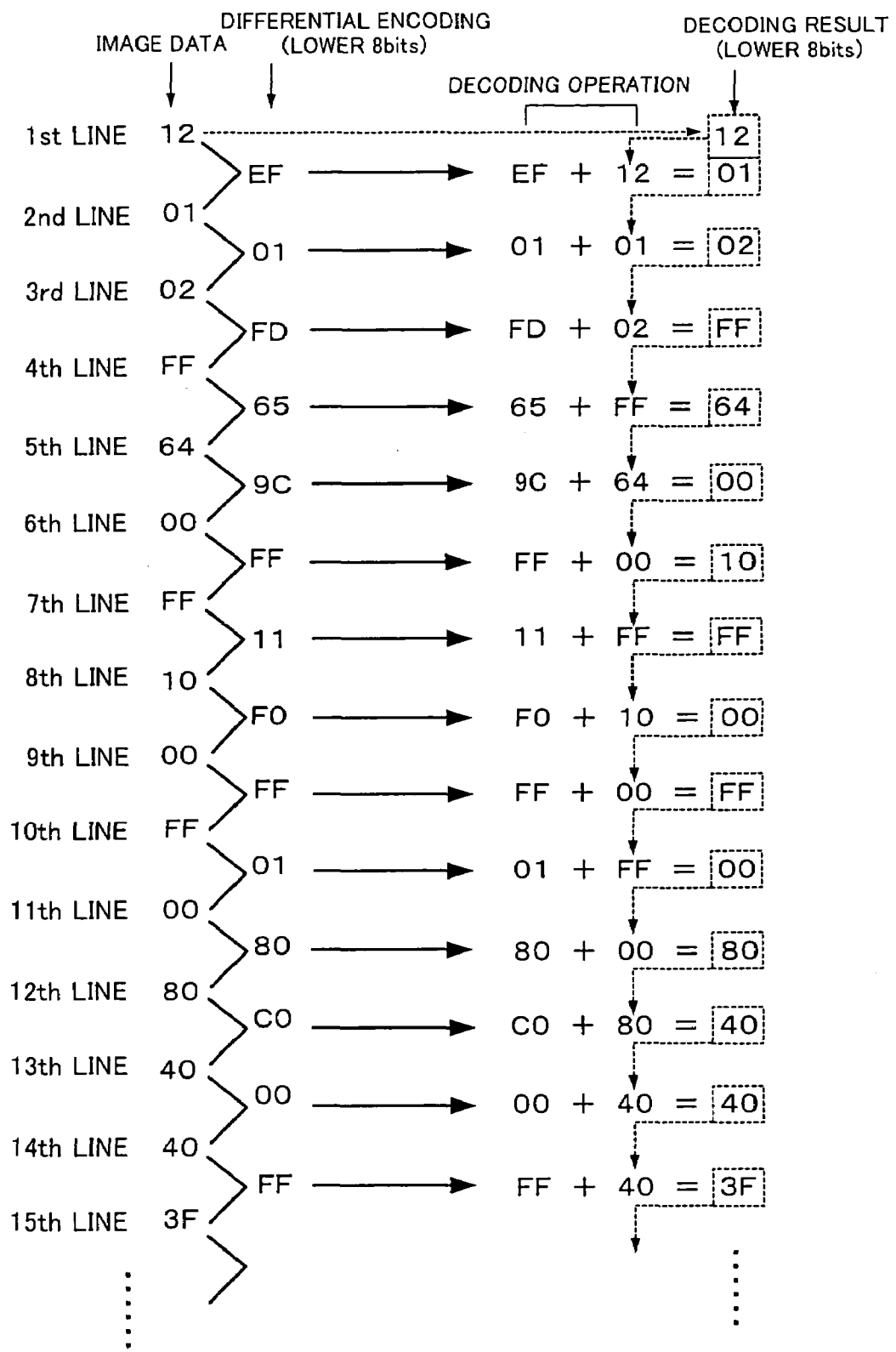
FIG. 7 is a view useful for understanding an example of a differential coding processing in the differential coding section constituting the image compression apparatus shown in FIG. 3.

FIG. 7 is a view useful for understanding an example of a differential coding processing in the differential coding section 510 constituting the image compression apparatus 500 shown in FIG. 3.

It is assumed that the pixel values on the vertical line in the sub-scanning direction shown in FIG. 6 are expressed, as shown in the column of "IMAGE DATA" in FIG. 7, as set forth below.

"12 01 02 FF 64 . . . 40 40 3F . . . "

where the pixel values are expressed by hexadecimal two digit (1 byte=8 bits). It is noted that the "line" denotes the pixels arranged in the main scanning direction.

First, with respect to the first line of pixel value "12", it is outputted directly.

Next, the first line of pixel value "12" is subtracted from the second line of pixel value "01" to output a result. The result of the subtraction of "12" from "01" is a negative number. This negative number is expressed by "1EF" in 9 bits. Here, however, "1", which is 1 bit in the MSB (Most Significant Bit), is omitted, and only "EF", which is 8 bits in the lower order of unit bit, is outputted.

Next, the second line of pixel value "01" is subtracted from the third line of pixel value "02", and a value "01" of a result is outputted.

Next, the third line of pixel value "02" is subtracted from the fourth line of pixel value "FF", and a value "FD" of a result is outputted.

Next, the fourth line of pixel value "FF" is subtracted from the fifth line of pixel value "64", and "1", which is 1 bit in the MSB, is omitted, and only "65", which is 8 bits in the lower order of unit bit, is outputted.

This operation is repeated to output data appearing in the column of "DIFFERENTIAL ENCODING (LOWER 8 bits)" in FIG. 7, as set forth below.

"(12) EF 01 FD 65 . . . C0 00 FE. . . "

To decode the differential encoded data as mentioned above, the interface equipment 200 shown in FIG. 1 performs an operation as shown in the right side of FIG. 7.

First, the first line of pixel value "−12" is left as it is.

With respect to the second line of pixel value, the first line of pixel value "12" is added to the differential value "EF" to obtain a result. Thus, the second line of pixel value is "01", which is expressed with 8 bits in the lower order of unit bit, of the result.

With respect to the third line of pixel value, the second line of pixel value "01" is added to the differential value "01" to obtain a result. Thus, the third line of pixel value is "02", which is obtained through the result by the addition.

With respect to the forth line of pixel value, the third line of pixel value "02" is added to the differential value "FD" to obtain a result. Thus, the forth line of pixel value is "FF", which is obtained through the result by the addition.

With respect to the fifth line of pixel value, the fourth line of pixel value "FF" is added to the differential value "65" to obtain a result. Thus, the fifth line of pixel value is "64", which is expressed with 8 bits in the lower order of unit bit, of the result.

Hereinafter, this operation is repeated to decode the differential encoded data to the data before the differential encoding.

The differential coding section 510 in FIG. 3 applies the differential coding as explained above to the image data. Data obtained through the differential coding is fed to the offset section 520 to add a predetermined offset value to the respective value of the data.

Here there will be explained effects of the differential coding and the offset, using an example of image data for CT.

Figure 8:
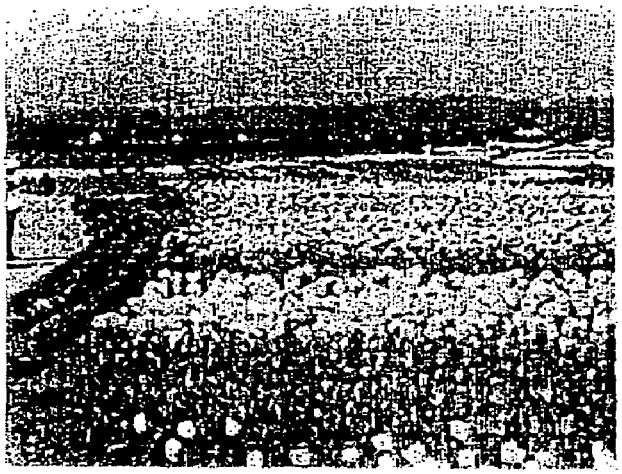
FIG. 8 is an explanatory view useful for understanding an example of image data for CT.
Figure 8:
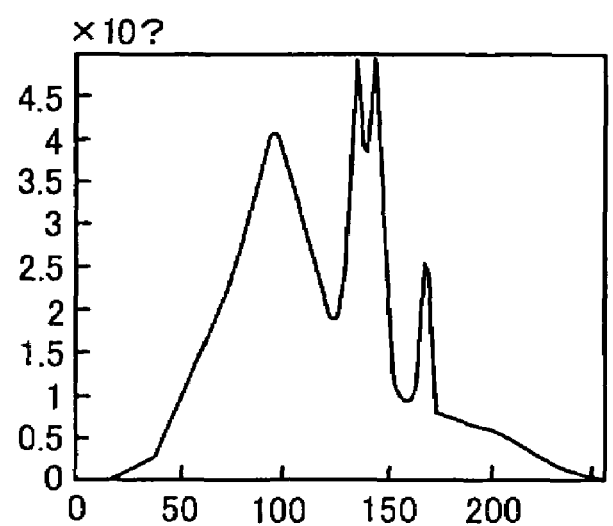

FIG. 8 is an explanatory view useful for understanding an example of image data for CT.

A part (A) of FIG. 8 shows a monochromatic landscape image as an example of a CT image represented by the image data for CT. According to the present embodiment, there is adopted image data in which density of a color in each pixel of the CT image is expressed by 8 bits of numerical value. A part (B) of FIG. 8 shows a histogram of data values in the image data representative of the landscape image shown in the part (A) of FIG. 8. The horizontal axis of the histogram represents data values. The vertical axis of the histogram represents data numbers (the number of pixels). Generally, the CT image is wide in width of the histogram, and it is extremely rare that an area of "0" in the number of data appears in the middle of a histogram, while ups and downs of the number of data occurs in the histogram.

Figure 9:
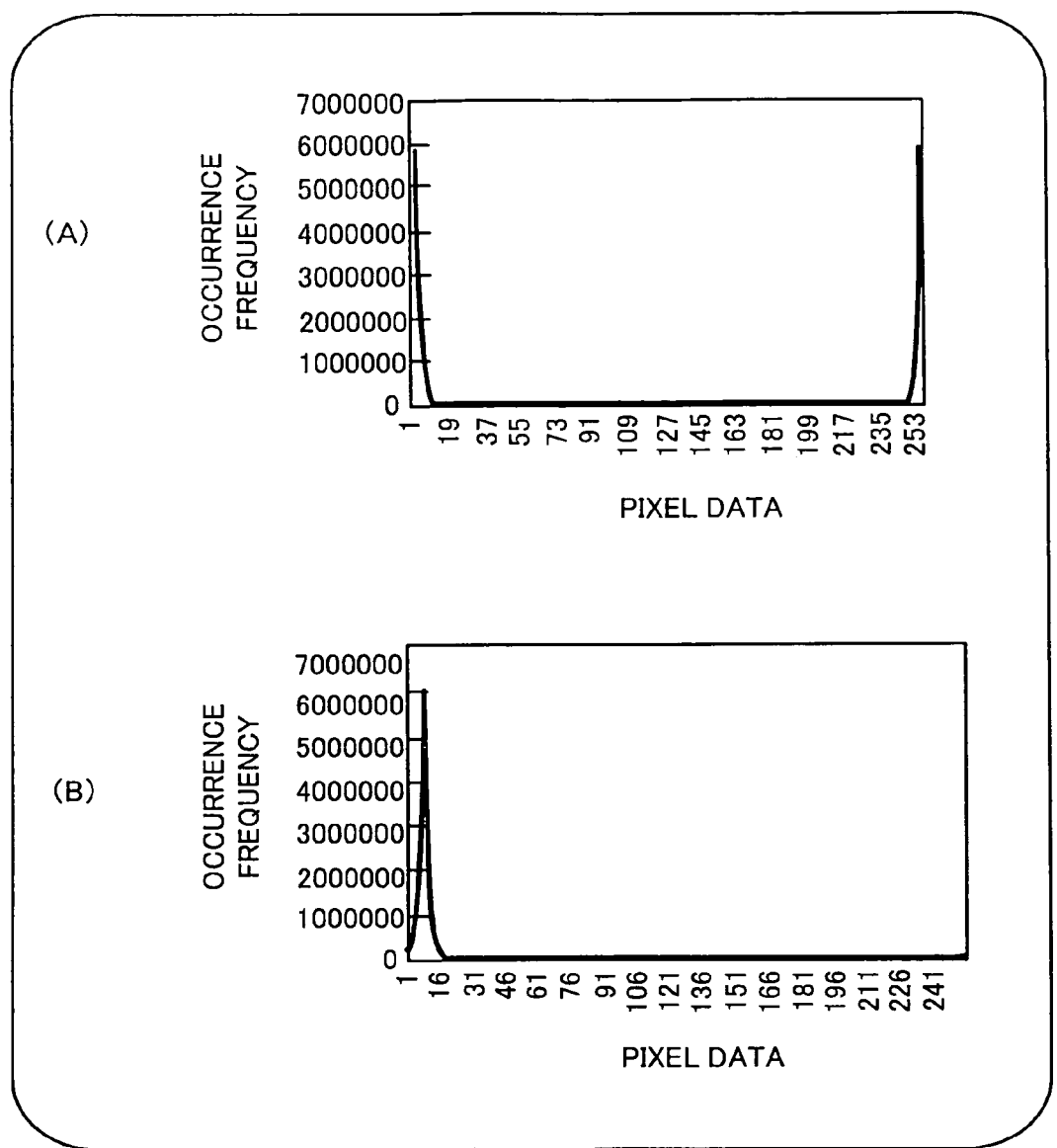
FIG. 9 is an explanatory view useful for understanding effects of differential coding and offset for the image data for CT.

FIG. 9 is an explanatory view useful for understanding effects of differential coding and offset for the image data for CT.

A part (A) of FIG. 9 shows a histogram of data, which is obtained through application of differential coding to the image data for CT shown in FIG. 8. The horizontal axis of the histogram represents data values. The vertical axis of the histogram represents occurrence frequency. When the differential coding, which is explained in conjunction with FIG. 6 and FIG. 7, is applied to the image data for CT, generally, a histogram of data offers, as shown in the part (A) of FIG. 9, the histogram having the sharp peaks on both the minimum data value and the maximum data value. When the offset is applied to such data, the histogram of the data offers, as shown in the part (B) of FIG. 9, the histogram having the sharp peak on the offset value. According to the present embodiment, as the offset value, there is adopted "8", and as result of the offset, the frequency of the data wherein values take 16 or more is substantially "0".

The data, which is deformed in the histogram by the differential coding and the offset, is divided by the plane divisional section 530 of FIG. 3 into the lower significant digit sub plane and the upper significant digit sub plane.

Figure 10:
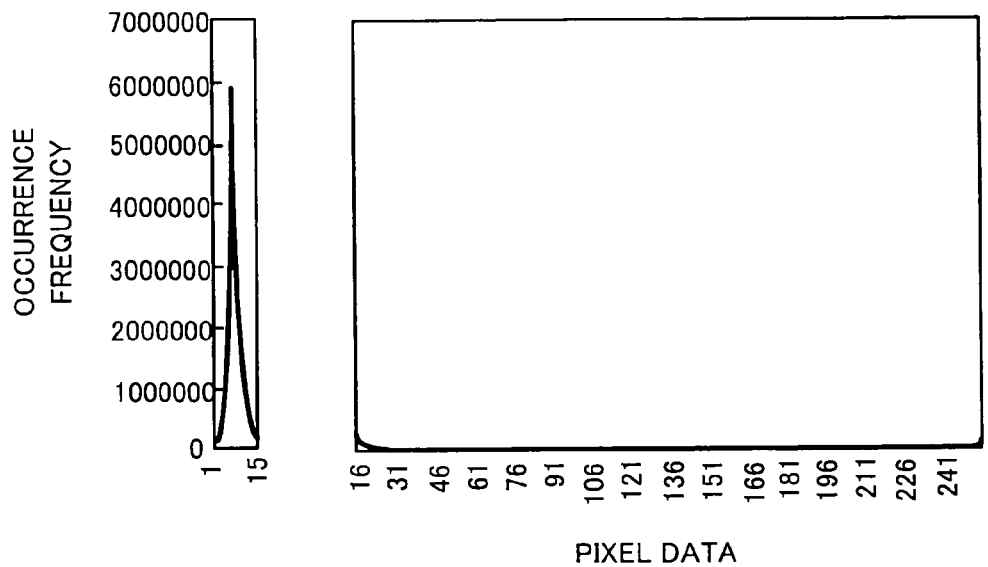
FIG. 10 is an explanatory view useful for understanding effects of the data division by the plane divisional section.

FIG. 10 is an explanatory view useful for understanding effects of the data division by the plane divisional section 530.

FIG. 10 shows a histogram in which the histogram shown in the part (B) of FIG. 9 is divided between the data value "15" and the data value "16". The data division by the plane divisional section 530 of FIG. 3 brings about effects corresponding to the division of the histogram as mentioned above. That is, according to the present embodiment, the division of the numerical values of 8 bits constituting the data into the upper significant digit 4 bits and the lower significant digit 4 bits makes it possible to obtain the lower significant digit sub plane consisting of the continuity of numerical values represented by the lower significant digit 4 bits and the upper significant digit sub plane consisting of the continuity of numerical values represented by the upper significant digit 4 bits. The numerical values of the lower significant digit 4 bits, which constitute the lower significant digit sub plane, represent the numerical values from the value "0" to the value "15". In case of the numerical values of the upper significant digit 4 bits, which constitute the upper significant digit sub plane, assuming that those numerical values represent 16 sorts of numerical values at 16 intervals from the value "16" to the value "256", the histogram of the lower significant digit sub plane is the substantially same as the histogram shown at the left of FIG. 10, and the histogram of the upper significant digit sub plane is the substantially same as the histogram shown at the right of FIG. 10. With respect to the upper significant digit sub plane, however, it is noted that the peak, of which height is equal to the area of the histogram shown at the left of FIG. 10, is added onto the data value "16" of the histogram shown at the right of FIG. 10.

The upper significant digit sub plane is fed to the run length coding section 551 constituting the H plane compression section 550 shown in FIG. 3.

According to the present embodiment, for convenience of processing, the run length coding section 551 deals with two sets of numerical values, each set consisting of continued 4 bits of numerical values constituting the upper significant digit sub plane, as a unit of 8 bits of numerical values. The following coding processing is applied to continuity of numerical values from the value "00" to the value "FF" in hexadecimal number system.

According to this coding processing, the coding processing is carried out on only the specific numerical values of a plurality of 8 bits of numerical values. Thus, the run length coding section 551 detects, of the received data, the numerical value to be subjected to the coding processing (this numerical value is referred to as "compression object numerical value"), and the continuity number of the compression object numerical value.

According to the present embodiment, by way of the example, three numerical numbers of "10", "FF" and "00" are established as the compression object numerical value.

Figure 11:
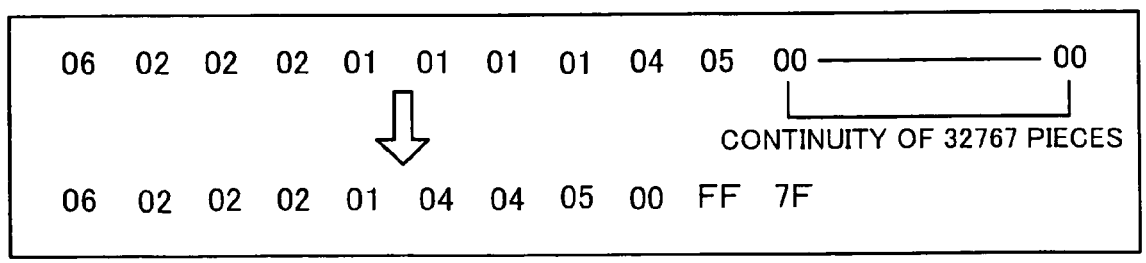
FIG. 11 is an explanatory view useful for understanding coding in the run length coding section shown in FIG. 4.

FIG. 11 is an explanatory view useful for understanding coding in the run length coding section 551 shown in FIG. 3.

The upper line in FIG. 11 is concerned with data constituting the upper significant digit sub plane, and the lower line is concerned with data subjected to the coding processing by the run length coding section 551.

Here, as shown in the upper line of FIG. 11, it is assumed that the following data is received from the plane divisional section 530.

"06 02 02 02 01 01 01 01 04 05 00 . . . "

In this case, the run length coding section 551 in FIG. 3 detects that the first numerical value "06" is not the compression subject numerical value, the successive numerical value "02 02 02" is also not the compression subject numerical value, the compression subject numerical values "01" continuously occur four times, and the compression subject numerical values "00" continuously occur 32767 times interposing the numerical values "04" and "05", which are not the compression subject numerical values.

Figure 12:
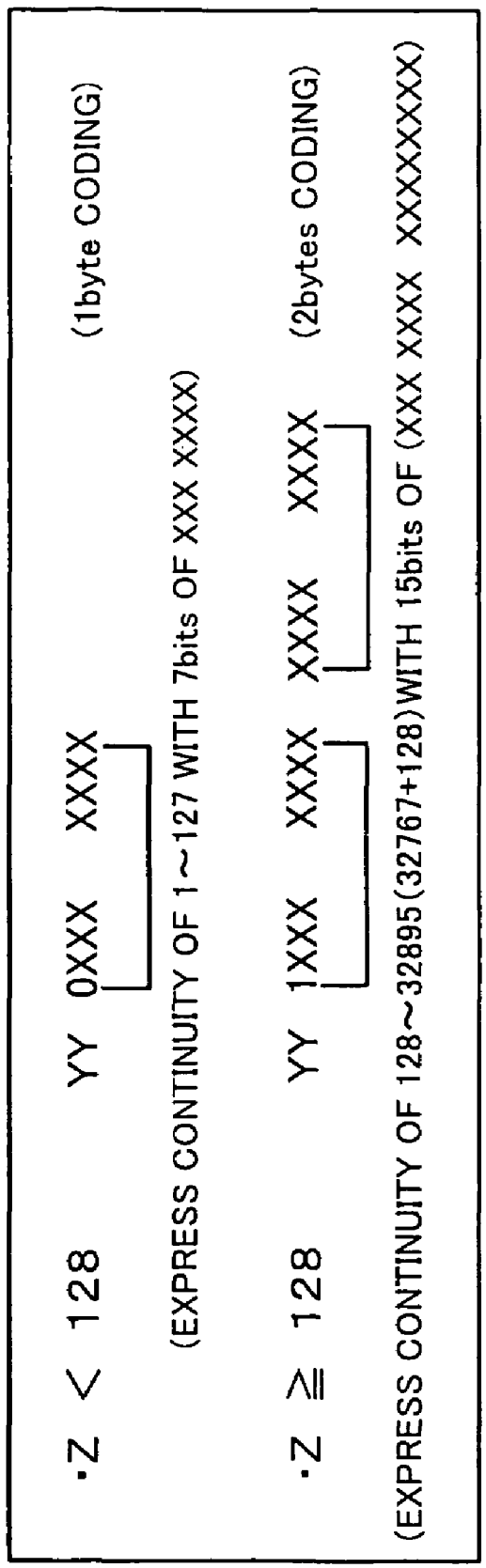
FIG. 12 is a view useful for understanding algorithm of coding for compression subject numerical values in the run length coding section.

FIG. 12 is a view useful for understanding algorithm of coding for compression subject numerical values in the run length coding section.

In FIG. 12, Z denotes a continued number of the same compression subject numerical value, for example, with respect to "01" on the upper line in FIG. 11, Z=4, and with respect to "00", Z=32767.

In FIG. 12, "YY" denotes the compression subject numerical value expressed by the hexadecimal two digit per se. "0" or "1" subsequent to "YY" denote "0" or "1" expressed with 1 bit, respectively. "XX . . . " denotes the value of Z, where one "X" represents 1 bit.

More in detail, in FIG. 12, in the event that the compression subject numerical value "YY" continues Z<128, the compression subject numerical value "YY" is expressed with the first one byte, the first bit is expressed by "0" with the subsequent one byte, and the value of Z is expressed with the subsequent 7 bits. And in the event that the compression subject numerical value "YY" continues Z≧128, the compression subject numerical value "YY" is expressed with the first one byte, the first bit of the subsequent 2 bytes (16 bits) is expressed by "1", so that the coding is expressed with 2 bytes, and the value of Z is expressed with the subsequent 15 bits.

Hereinafter, there will be explained an example of the coding shown in FIG. 11 in accordance with the rule shown in FIG. 12.

Since the first numerical value "06", which constitutes the data (on the upper line) received from the plane divisional section 530 in FIG. 3, is not the compression subject numerical value, the value "06" is directly outputted. Further, since the subsequent numerical values "02 02 02" are also not the compression subject numerical value, those three values "02" are also directly outputted. Next, since four pieces of compression subject numerical value "01" continue, the values are coded into "01 04". Since the subsequent numerical values "04 05" are not the compression subject numerical value, those values "04" and "05" are directly outputted.

Next, since 32767 pieces of numerical value "00" continue, "00" is established, and the first one bit of the next one byte is expressed by "1" and 32767-128 is expressed with 15 bits, so that three bytes of "00 FF 7F" express that 32767 pieces of "00" continue. That is, the continued number 128 is expressed with "00 00", except for the first bit "1".

Figure 13:
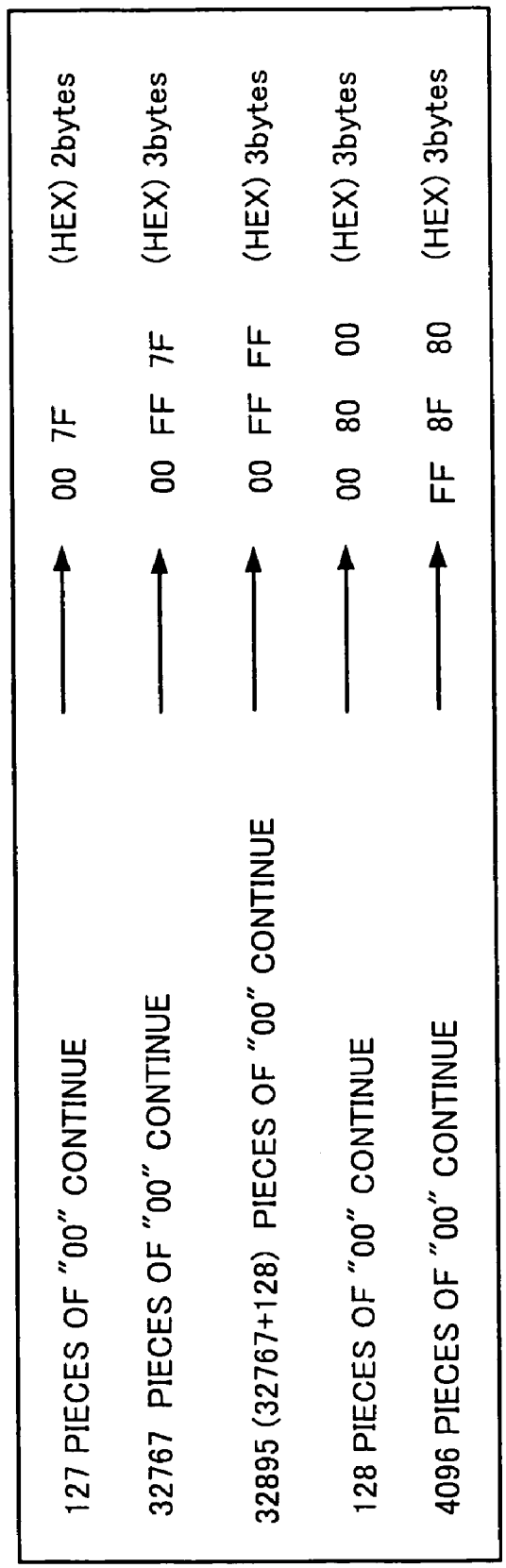
FIG. 13 is an explanatory view useful for understanding an example of the coding processing according to the continued number in the run length coding section shown in FIG. 3.

FIG. 13 is an explanatory view useful for understanding an example of the coding processing according to the continued number in the run length coding section 551 shown in FIG. 3.

When 127 pieces of "00" continue, the use of 2 bytes encodes data to "00 7E".

When 32767 pieces of "00" continue, the use of 3 bytes encodes data to "00 FF 7E".

When 32895 pieces of "00" continue, the use of 3 bytes encodes data to "00 FF FF".

When 128 pieces of "00" continue, the use of 3 bytes encodes data to "00 80 00".

When 4096 pieces of "FF" continue, the use of 3 bytes encodes data to "FF 8F 80".

The run length coding section 551 shown in FIG. 3 performs the coding processing as mentioned above.

According to the run length coding section 551 of the present embodiment, the maximum bulk compressibility is improved to 3/32895=1/10965. With respect to the data of the upper significant digit sub plane, which is the object of the coding processing by the run length coding section 551, as mentioned above in conjunction with the histogram of FIG. 10, almost of the 4 bits of numerical values offers the numerical value "0" representative of the data value "16". Many numerical values of 8 bits consisting of the 4 bits of numerical values offer the numerical value "00" in the hexadecimal number system. Thus, it is possible to expect great data compression through coding processing by the run length coding section 551.

The data, which is subjected to the coding processing in the run length coding section 551 in FIG. 3, is fed to the data scanning section 552 and the Huffman coding section 553, which constitute the H plane compression section 550 of FIG. 3.

The data scanning section 552 scans the data outputted from the run length coding section 551 in its entirety to determine frequency of occurrence of the data values.

Figures 14, 15:
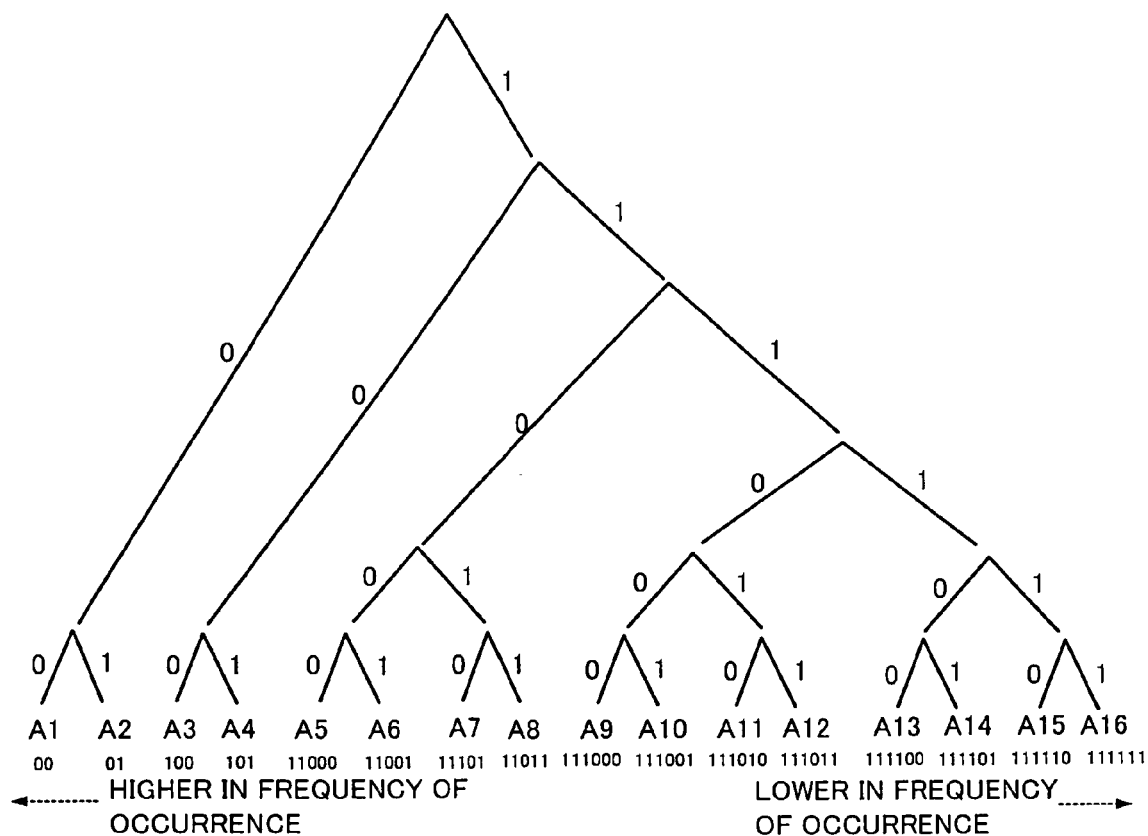
FIG. 14 is a view useful for understanding an example of a scanning result by a data scanning section.
FIG. 15 is a view useful for understanding an example of the Huffman table.

FIG. 14 is a view useful for understanding an example of a scanning result by the data scanning section 552.

Here, the frequency of occurrence of the pixel value "A1" is highest, and "A2", "A3", "A4" . . . are higher in the named order. Incidentally, "A1" "A2", "A3", "A4" . . . do not represent directly the numerical value, and are codes each representative of the numerical value. That is, "A1" denotes, for example, the numerical value "00", and "A2" denotes, for example, the numerical value "FF". Further, according to the present embodiment, for the purpose of simplification, it is assumed that all pixels of data, which is transmitted from the run length coding section 551 in FIG. 3, are represented by anyone of 16 pieces of numerical values "A1" to "A16". The data scanning section 552 allots codes to the 16 pieces of numerical values in accordance with the frequency of occurrence to create the Huffman table. More in detail, allotted to "A1", which is highest in frequency of occurrence, is a code "00" expressed with 2 bits. Allotted to "A2" is a code "01" expressed with 2 bits. Allotted to "A3" and "A4" are codes "100" and "101", respectively, which are expressed with 3 bits. And allotted to "A5" to "A8" are the associated codes, respectively, which are expressed with 5 bits. Hereinafter, in a similar fashion, allotted to the lower numerical values in frequency of occurrence are the associated codes with the more number of bits, respectively.

FIG. 15 is a view useful for understanding an example of the Huffman table.

The Huffman table is harmonized with FIG. 14. That is, the Huffman table is a table that indicates an association between numerical values before coding (before replacement) and numerical values after coding (after replacement) so that the higher code in the frequency of occurrence is replaced by numerical values expressed with the shorter number of bits.

The Huffman coding section 553 of the H plane compression section 550 shown in FIG. 3 encodes the numerical values of data in accordance with the Huffman table, so that a replacement of many numerical values by codes of short bit number may implement the data compression.

Thus, with respect to the upper significant digit sub plane D1H to be fed to the H plane compression section 550 shown in FIG. 3, an application of both the coding by the run length coding section 551 and the coding by the Huffman coding section 553 makes it possible to create the upper significant digit compressed data D2H through compression in high compressibility.

On the other hand, the Huffman coding section 541 of the L plane compression section 540 shown in FIG. 3 performs, in a similar fashion to that of the run length coding section 551 of the H plane compression section 550, coding processing wherein two sets of numerical values, each set consisting of continued 4 bits of numerical values constituting the lower significant digit sub plane, are regarded as a unit of 8 bits of numerical values. According to the coding processing of the Huffman coding section 541, the similar processing to the Huffman coding section 553 of the H plane compression section 550, excepting that the fixed Huffman table is used, is carried out. As a result, the lower significant digit sub plane D1L offers the lower significant digit compressed data D2L.

When the image compression apparatus 500 shown in FIG. 3 carries out the various sorts of processing as mentioned above, the image compression apparatus 500 can compress the image data through the reversible compression, and as a result, it is possible to implement great compression particularly on data of CT image.

The above-mentioned description is concerned with the explanation of the first embodiment. Next, there will be explained a second embodiment. The second embodiment is the same as the first embodiment excepting an adoption of a two-dimensional differential coding and a contribution to the optimization of the Huffman table, and thus redundant explanation will be omitted.

Figure 18:
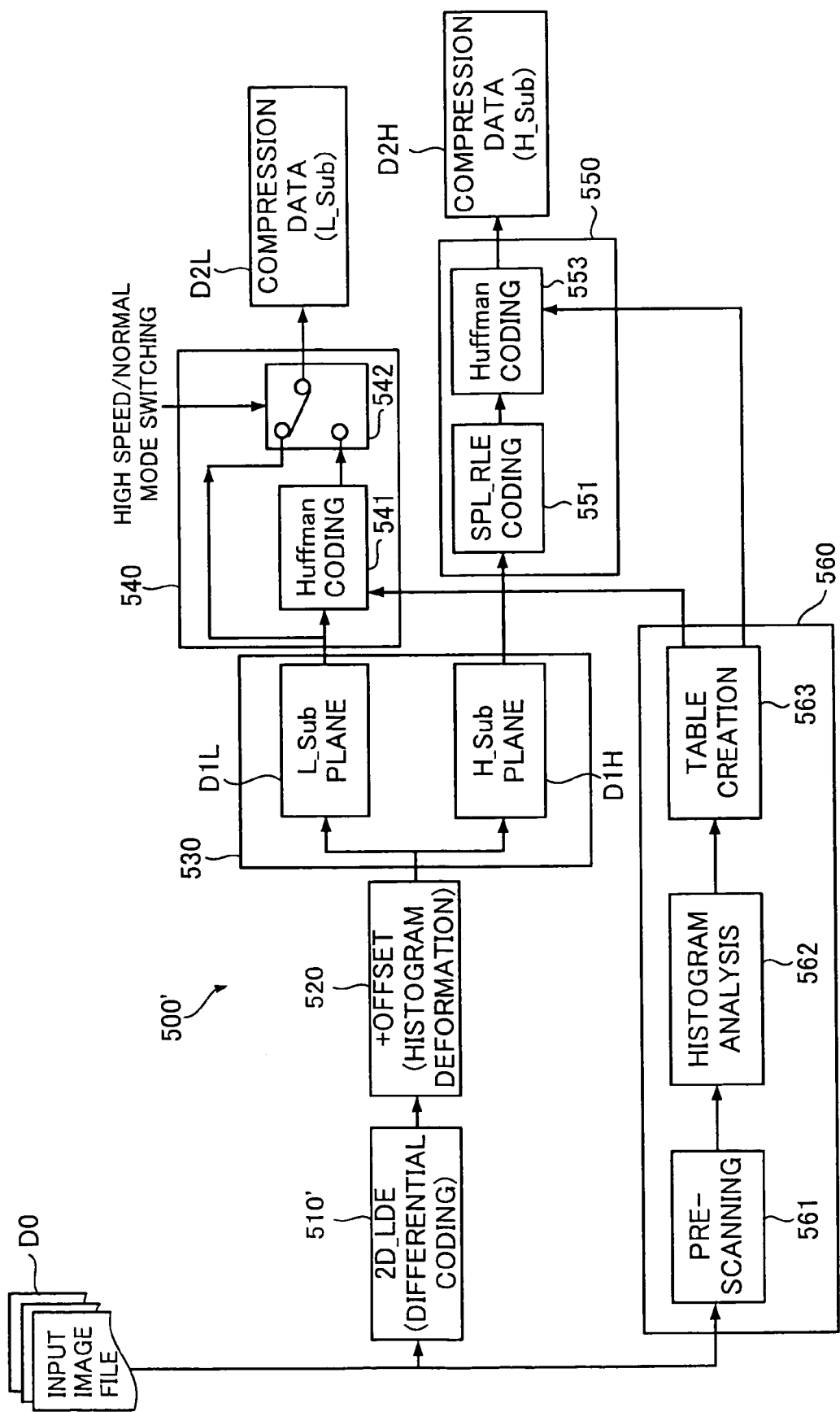
FIG. 18 is a block diagram of an image compression apparatus corresponding to a second embodiment of a data compression apparatus of the present invention.

FIG. 18 is a block diagram of an image compression apparatus corresponding to the second embodiment of an image compression apparatus of the present invention.

An image compression apparatus 500' shown in FIG. 18 comprises a differential coding section 510', an offset section 520, a plane divisional section 530, an L plane compression section 540, an H plane compression section 550, and an optimum Huffman table creation section 560.

An input image file D0 is inputted to both the differential coding section 510' and the optimum Huffman table creation section 560. The data fed to the differential coding section 510' is subjected to the compression processing to produce compressed data. The data fed to the optimum Huffman table creation section 560 is used for the optimization of the Huffman table.

The differential coding section 510' performs the two-dimensional coding processing in which as to the continuity of numerical values constituting the received data, a two-dimensional difference is determined in accordance with a plurality of numerical values adjacent to the numerical values (first occurrence) in a plurality of directions looking on the image so that there is created image data consisting of the continuity of numerical values of 8 bits representative of the two-dimensional difference. The differential coding section 510' corresponds to an example of the difference creating section and the two-dimensional difference creating section referred to in the present invention.

For the Huffman coding by the L plane compression section 540 and the H plane compression section 550, there is used the Huffman table that is optimized to the image of the compression object. The optimum Huffman table creation section 560 creates such Huffman table. The optimum Huffman table creation section 560 corresponds to an example of the allocation section referred to in the present invention.

The image data, which is transferred to the optimum Huffman table creation section 560, is first fed to a pre-scanning section 561. The pre-scanning section 561 extracts from the image data partial data corresponding to a part of the image, and applies to the partial data the same processing as the processing of the differential coding section 510, the offset section 520, the plane divisional section 530, and the run length coding section 551.

The data, which is subjected to the processing of the pre-scanning section 561, is fed to a histogram analyzing section 562. The histogram analyzing section 562 determines an occurrence frequency (a histogram) of all numerical values appearing in the data.

The data histogram (the occurrence frequency of numerical values), which is determined by the histogram analyzing section 562, is transferred to a table creating section 563. The table creating section 563 creates Huffman tables, which are optimum for a compression of data to be compressed, in accordance with the received data histogram for the L plane compression section 540 and the H plane compression section 550.

The thus created Huffman tables are transferred to the Huffman coding section 541 and the Huffman coding section 553 of the L plane compression section 540 and the H plane compression section 550, respectively. The Huffman coding section 541 and the Huffman coding section 553 perform the Huffman coding in accordance with the received Huffman tables so as to output the lower significant digit compressed data D2L and the upper significant digit compressed data D2H, respectively.

Figure 19:
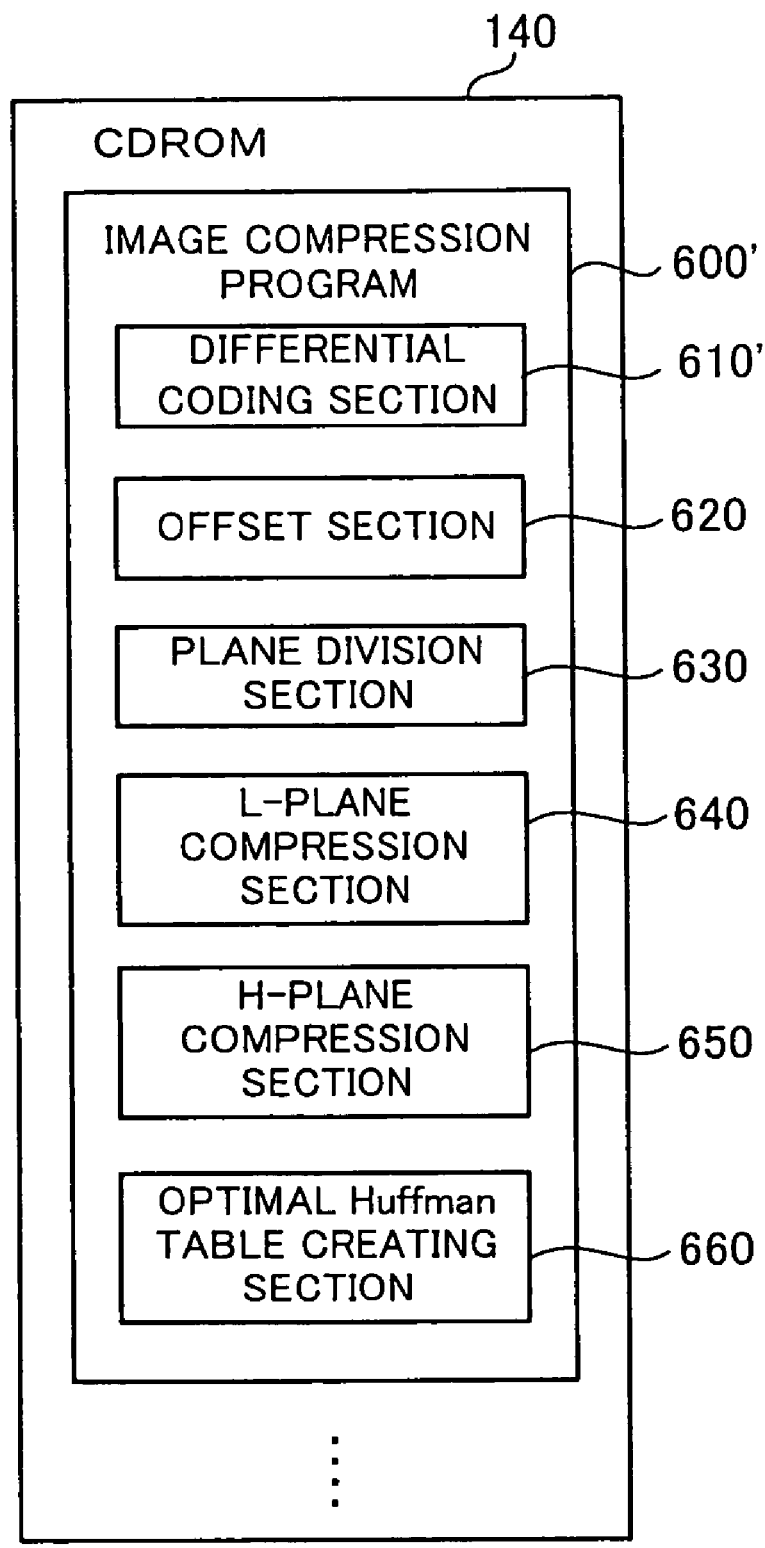
FIG. 19 is a typical structural view of an image compression program corresponding to a second embodiment of a data compression program stored in a data compression program storage medium of the present invention.

FIG. 19 is a typical structural view of an image compression program corresponding to a second embodiment of a data compression program stored in a data compression program storage medium of the present invention.

An image compression program 600' is stored in the CD-ROM 140.

The image compression program 600' comprises a differential coding section 610', an offset section 620, a plane divisional section 630, an L plane compression section 640, an H plane compression section 650, and an optimal Huffman table creating section 660. The CD-ROM 140 stores therein various sorts of programs for executing a series of processing in the host controller 100 shown in FIG. 1, as well as the data compression program 600'. Those programs are the same as the conventional one, and thus the redundant explanation will be omitted.

When the CD-ROM 140 shown in FIG. 19 is mounted on the host controller 100 shown in FIG. 4 so as to be accessed by the CD-ROM drive 116, the image compression program 600 stored in the CD-ROM 140 is up-loaded on the host controller 100 and is stored in the hard disk 104. Thus, the image compression program 600 stored in the hard disk 104 is read from the hard disk 104 and is developed in the RAM 112. When the CPU 111 executes the developed image compression program, the host controller 100 operates as an apparatus for executing various sorts of processing as the host controller, including processing as the image compression apparatus 500' shown in FIG. 18.

Here, when the image compression program 600' shown in FIG. 19 is installed in the host controller 100 and is executed in the CPU 111, the image compression program 600 implements the image compression apparatus 500' shown in FIG. 18 in the host controller 100. When the CPU 111 executes the differential coding section 610', the offset section 620, the plane divisional section 630, the L plane compression section 640, the H plane compression section 650, and the optimal Huffman table creating section 660, those sections serve as program parts that cause the host controller 100 to operate as the differential coding section 510', the offset section 520, the plane divisional section 530, the L plane compression section 540, the H plane compression section 550, and the optimal Huffman table creating section 560, respectively, which constitute the image compression apparatus 500' shown in FIG. 18. That is, those program parts make it possible to substantially constitute the structural elements of the image compression apparatus 500' on the host controller 100.

Functions of the sections 610' to 660 that constitute the image compression program 600' shown in FIG. 19, wherein those sections 610' to 660 are executed in the CPU 111, are the completely same as functions of the sections 510' to 560 that constitute the image compression apparatus 500 shown in FIG. 3, respectively. Accordingly, the above-mentioned explanation as to the sections 510' to 560 of the image compression apparatus 500' shown in FIG. 18 and the detailed explanation, which will be described later, may serve as the explanation for the sections 610' to 660 that constitute the image compression program 600' shown in FIG. 19.

Figure 20:
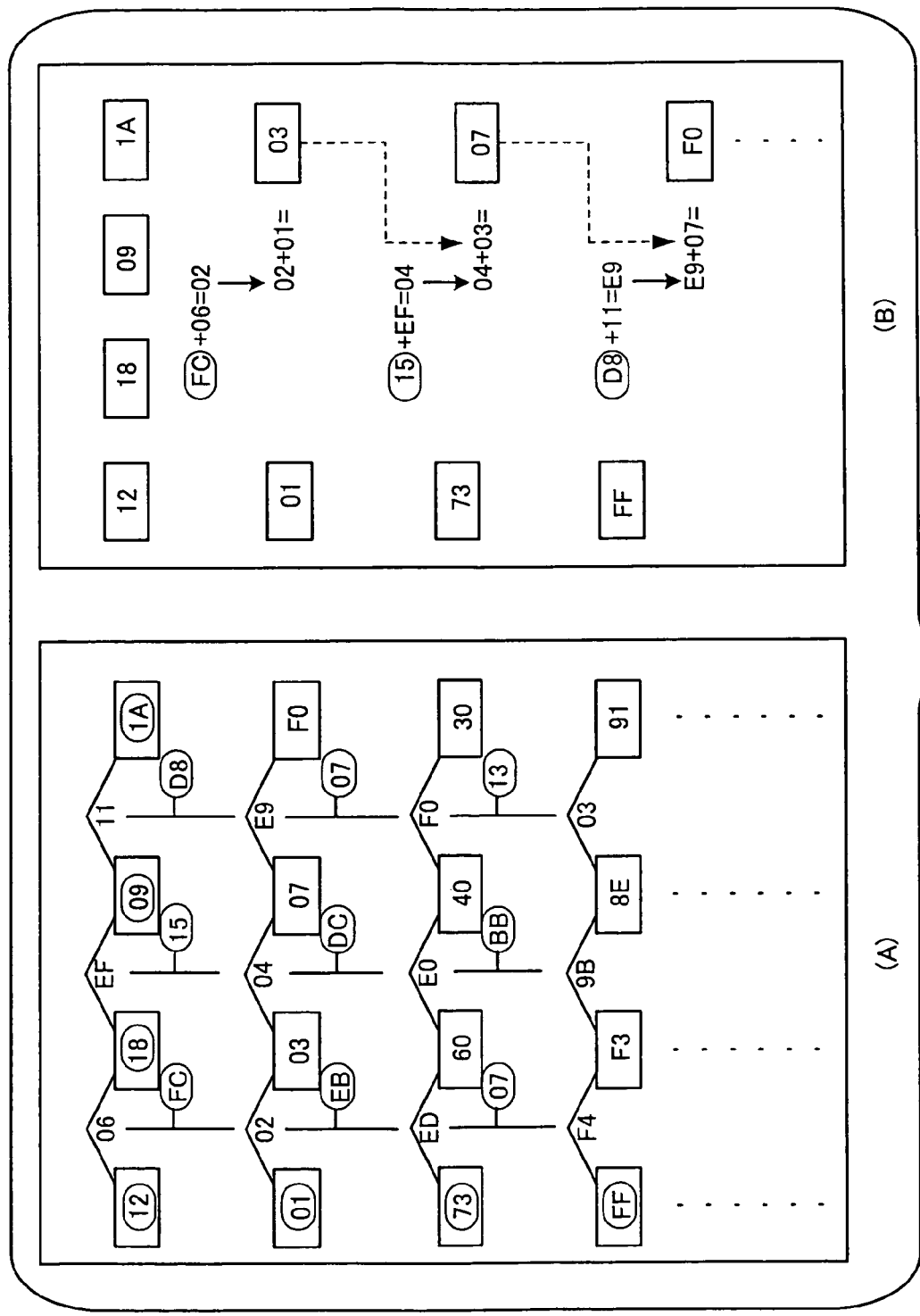
FIG. 20 is a view useful for understanding an example of a two-dimensional differential coding processing in the differential coding section constituting the image compression apparatus shown in FIG. 18.

FIG. 20 is a view useful for understanding an example of a two-dimensional differential coding processing in the differential coding section 510' constituting the image compression apparatus 500' shown in FIG. 18.

It is assumed that of the numerical values shown in a part (A) of FIG. 20, numerical values "12 18 09 1A . . . 01 03 07 F0 . . . ", which are encircled with a square, denote pixel values constituting image data, and numerical values "12 18 09 1A . . . 01 FC 15 D8 . . . ", which are encircled with a circle, denote output values to be outputted through two-dimensional differential coding processing. It is noted that the "line" denotes the pixels arranged in the main scanning direction (a horizontal direction in the figure).

In the two-dimensional differential coding processing, first, with respect to the first line of pixel values "12 18 09 1A . . . ", those values are outputted directly. And there are computed differences "18–12=06" "09–18=EF" . . . , each representing difference between pixel values adjacent to one another in the main scanning direction. A result of the subtraction "09–18", for instance, takes a negative number, and is expressed by "1EF" in 9 bits. Here, however, "1", which is 1 bit in the MSB (Most Significant Bit), is omitted, and only "EF", which is 8 bits in the lower order of unit bit, is outputted.

Next, with respect to the second line, only the first pixel value "01" is outputted directly, and there are computed differences "03–01=02" "07–03=04" . . . , each representing difference between pixel values adjacent to one another in the main scanning direction. And there is determined and outputted further differences "02–06=FC" "04–EF=15" . . . between the first line of differences "06 EF 11 . . . " and the second line of differences "02 04 E9 . . . ".

Next, with respect to the third line, the similar processing to that of the second processing is applied, and only the first pixel value "73" is outputted directly, and there are computed differences "60–73=ED" "40–60=E0" . . . , each representing difference between pixel values adjacent to one another in the main scanning direction. And there is determined and outputted further differences "ED–02=EB" "E–04=DC" . . . between the second line of differences "02 04 E9 . . . " and the third line of differences "ED E0 F0 . . . ".

This operation is repeated to output numerical numbers encircled with a circle in FIG. 20, as set forth below.

"12 18 09 1A . . . 01 FC 15 D8 . . . 73 EB DC 07 . . . FF 07 BB 13 . . . "

To decode the two-differential encoded data as mentioned above, the interface equipment 200 shown in FIG. 1 performs an operation as shown in the right side (a part (B)) of FIG. 20.

First, the first line of pixel value "12 18 09 1A . . . " is left as it is.

With respect to the second line et seqq., the first pixel values "01" "73" "FF" are left as they are.

Here, by way of an example, the second line of second and after differential values "FC 15 D8 . . . " are taken, there will be explained a procedure in which the original pixel values are decoded in accordance with the differential values.

To decode pixel values, with respect to the pixel of interest, there are used three pixel values for three pixels, that is, a pixel appearing at the preceding position (the left side in the figure) on the same line, a pixel appearing at the same position on the preceding line (the upper side in the figure), and a pixel appearing at the preceding position on the preceding line.

With respect to the second line of second pixel of differential value "FC", there are used first line of first pixel of pixel value "12", first line of second pixel of pixel value "18", and second line of first pixel of pixel value "01". And first, a difference "18−12=6" between the first line of second pixel of pixel value "18" and the first line of first pixel of pixel value "12" is determined. Next, the difference "06" is added to the differential value "FC" of interest to obtain a result. Thus, there is obtained a value "02", which is expressed with 8 bits in the lower order of unit bit, of the result. A second line of first pixel of pixel value "01" is added to the value "02" to obtain a result. Thus, the value is "03", which is expressed with 8 bits in the lower order of unit bit, of the result. The value "03" is decoded as second line of second pixel of pixel value.

With respect to the second line of third pixel of pixel value, a difference "09−18=EF" between the first line of third pixel of pixel value and the first line of second pixel of pixel value is added to the differential value "15" to obtain a result. Thus, there is obtained a pixel value "04", which is expressed with 8 bits in the lower order of unit bit, of the result. And second line of second pixel of pixel value "03" is added to the pixel value "04". Thus, there is obtained a pixel value "07", which is expressed with 8 bits in the lower order of unit bit, of the result.

With respect to the second line of forth pixel of pixel value, a difference "1A−09=11" between the first line of fort pixel of pixel value and the first line of third pixel of pixel value is added to the differential value "D8" to obtain a result. Thus, there is obtained a pixel value "E9", which is expressed with 8 bits in the lower order of unit bit, of the result. And second line of third pixel of pixel value "07" is added to the pixel value "E9". Thus, there is obtained a pixel value "F0", which is expressed with 8 bits in the lower order of unit bit, of the result.

Hereinafter, this operation is repeated to decode the differential encoded values to the pixel values before the two-dimensional differential encoding.

The differential coding section 510' in FIG. 18 applies the two-dimensional differential coding as explained above to the image data. Data obtained through the two-dimensional differential coding is fed to the offset section 520 in FIG. 18 to add a predetermined offset value to the respective value of the data in a similar fashion to that of the first embodiment.

Here there will be explained effects of the two-dimensional differential coding in the second embodiment.

Figure 16:
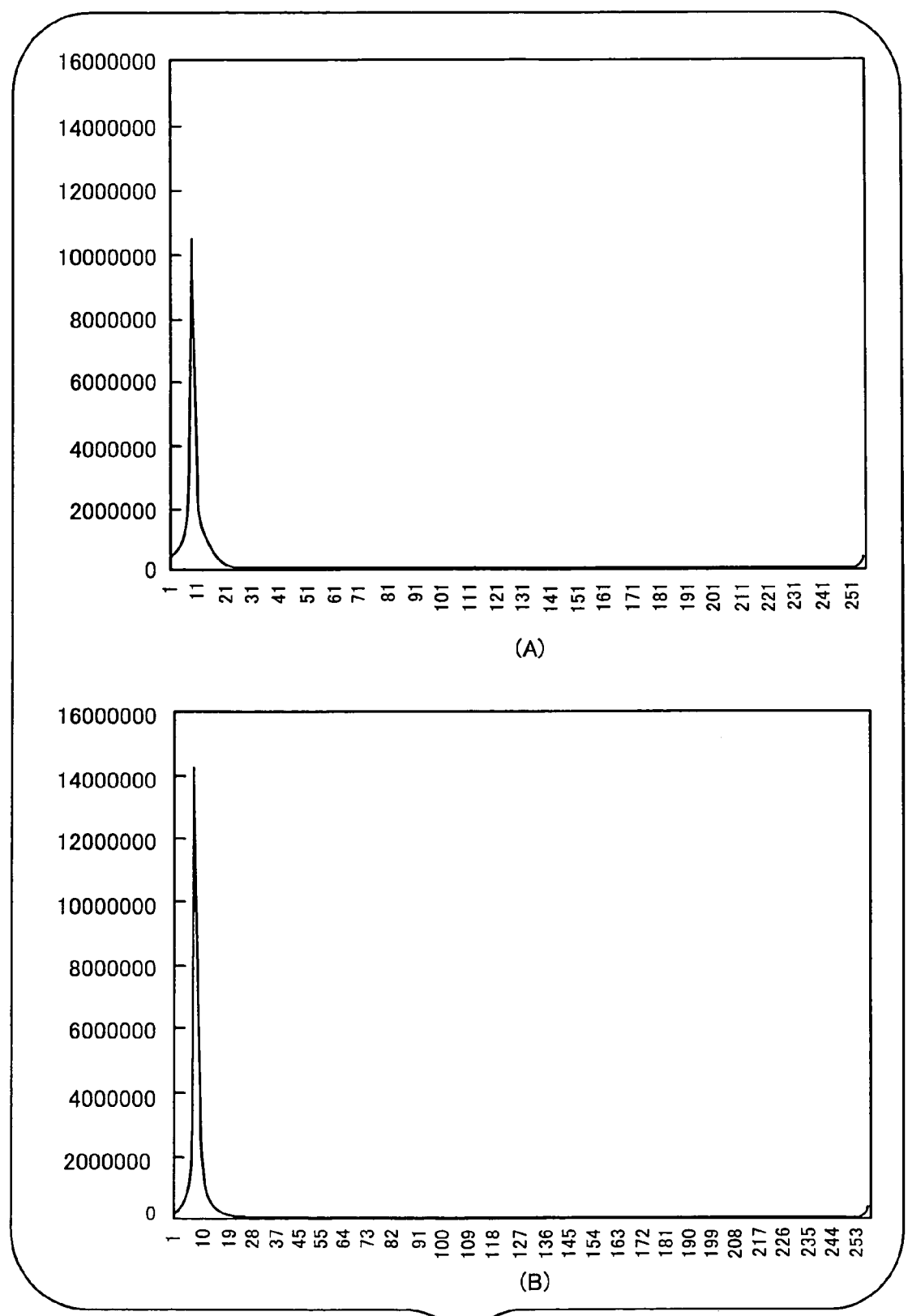
FIG. 16 is a view of histograms after offset of data obtained through a differential coding.

FIG. 16 is a view of histograms after offset of data obtained through a differential coding.

A part (A) of FIG. 16 shows a histogram of data, which is subjected to the offset after one-dimensional differential coding. A part (B) of FIG. 16 shows a histogram of data, which is subjected to the offset after two-dimensional differential coding. As will be seen from a comparison of those histograms, the histogram of the part (B) of FIG. 16 is smaller in skirts of the peak, and is higher in degree of data concentration to the peak. As a result, in the succeeding Huffman coding, the data, which is subjected to the two-dimensional differential coding, is more compressed.

Figure 17:
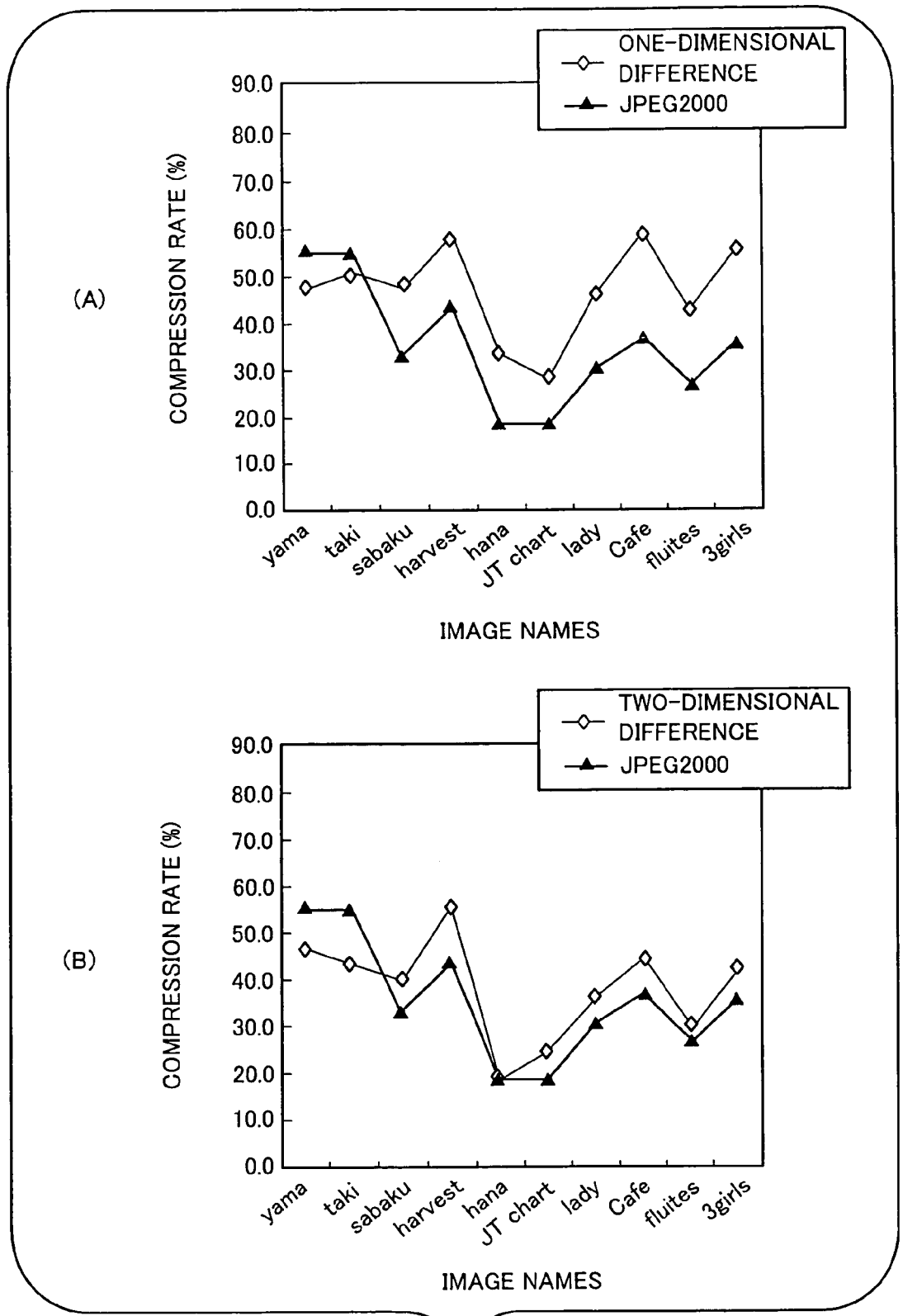
FIG. 17 is an explanatory view useful for understanding effects of compression through an adoption of a two-dimensional differential coding.

FIG. 17 is an explanatory view useful for understanding effects of compression through an adoption of the two-dimensional differential coding.

FIG. 17 shows compressibility for ten sorts of typical CT image of data. For the sake of comparison, there are also shown compressibility by JPEG 2000 of the reversible compression system, which is known as the compression system in which particularly high compressibility can be obtained in the conventional compression technology. A part (A) of FIG. 17 shows compressibility of data, which is subjected to the one-dimensional differential coding. A part (B) of FIG. 17 shows compressibility of data, which is subjected to the two-dimensional differential coding. The compressibility is expressed by rate in which the original data is 100%. A so-called "high compressibility" means that the numerical value of the compressibility is small.

As seen from the part (A) of FIG. 17, the compressibility of data, which is subjected to the one-dimensional differential coding, are inferior to the compressibility by the JPEG 2000 by about 10% to 20%. On the other hand, as seen from the part (B) of FIG. 17, the compressibility of data, which is subjected to the two-dimensional differential coding, are closed to the compressibility by the JPEG 2000 to several percent. Thus it is possible to implement high compressibility while it is concerned with the reversible compression.

Next, there will be explained optimizing procedure and optimizing effects as to the Huffman table to individual image data by the optimum Huffman table creation section 560.

The optimum Huffman table creation section 560 of FIG. 18 receives the same image data as the image data fed to the differential coding section 510'.

The image data fed to the optimum Huffman table creation section 560 is first transferred to the pre-scanning section 561. The pre-scanning section 561 extracts from the image data partial data corresponding to a part of the image. The partial data is extracted from the respective part of the image. The partial data, which is extracted from one part, consists of a predetermined number of pixels (for example, 8 pixels×8 pixels). According to the present embodiment, the pre-scanning section 561 extracts partial data corresponding to pixels of about one-hundredth of the total pixels of the original image data. The pre-scanning section 561 applies to the thus extracted partial data the same processing as the differential coding section 510, the offset section 520, and the plane divisional section 530 so as to create upper significant data and lower significant data. The pre-scanning section 561 applies to the upper significant data the same processing as that of the run length coding section 551.

The histogram analyzing section 562 of FIG. 3 receives the thus obtained processed upper significant data and lower significant data, and determines occurrence frequency (histogram) of all numerical values appearing on every data. This histogram is created in accordance with the partial data corresponding to pixels of about one-hundredth of the total pixels of the original image data. However, since the partial data is extracted from every portion of the image represented by the original image data, the partial data may reflect sufficiently the aspects of the data distribution in the individual image. The data histogram thus determined varies in width of the peak and expansion of the skirts in accordance with the aspects of the individual image.

The table creating section 563 receives the data histogram (occurrence frequency of numerical values) determined by the histogram analyzing section 562. The table creating section 563 prepares on the Huffman table code trains suitable for the aspects of data distribution in the data histogram.

Figure 22:
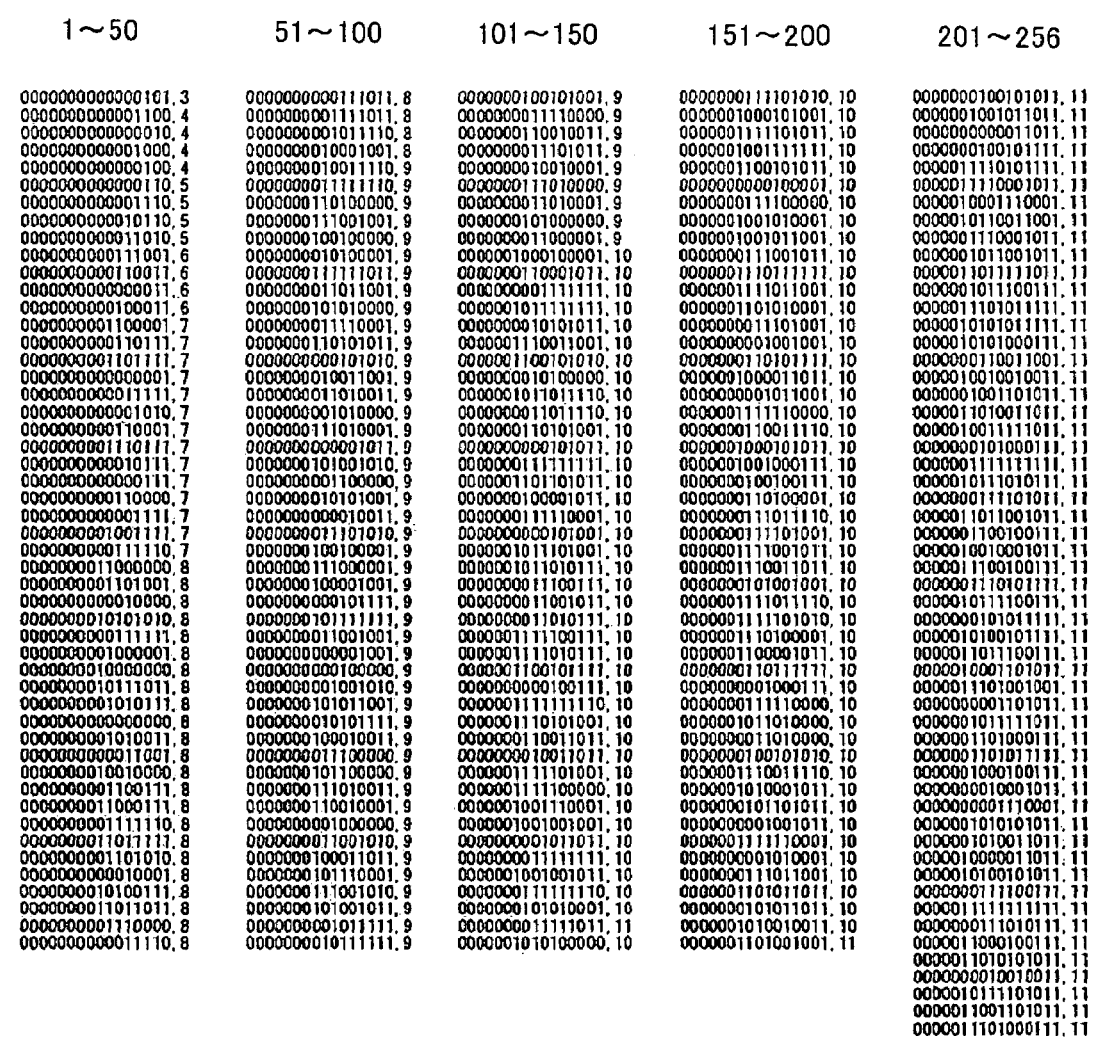

FIG. 21 is a view showing an example of a code train, which is prepared in the Huffman table. FIG. 22 is a view showing another example of a code train, which is prepared in the Huffman table.

FIG. 21 shows an example wherein data is concentrated particularly to the peak. FIG. 22 shows an example wherein a skirt of the peak is somewhat wide.

In FIG. 21 and FIG. 22, a one-digit number appearing at the right side as to the mark "," of every code train means a bit length, and binary codes corresponding to the bit length appearing at the left side as to the mark "," directed from the left to the right represent actual codes. For example, in case of the code train of FIG. 21, upper left first code is 2 bits of "11", next second code is 3 bits of "011", a subsequent third code is 3 bits of "010", and a further subsequent fourth code is 4 bits of "1010".

In case of the code train of FIG. 21, up to third code is very short code of 3 bits or less, but twelfth et seqq. code is a lengthy code not less than 9 bits. To the contrary, in case of the code train of FIG. 22, the very short code of 3 bits or less is the first code only, but up to thirteenth code is short code of 6 bits or less.

Such a code train is prepared on each of the upper significant data and the lower significant data, and numerical values are allotted to the code train to complete the Huffman table. A concept of the allocation of the numerical values is the same as that of the explanation with reference to FIG. 14, and thus the redundant explanation will be omitted.

The creation of the Huffman table by the optimum Huffman table creation section 560 is made in accordance with the partial data corresponding to pixels of about one-hundredth of the total pixels of the original image data, and thus may be executed in short time. And usually the compression of the image data is sequentially executed through dividing the image every 8 lines, but it is necessary for the Huffman table to prepare one table for the image in its entirety. According to the optimum Huffman table creation section 560, the Huffman table is created in the different root, and thus it is possible to perform the coding processing with the optimum Huffman table, which reflects the aspects of the image in its entirety, for the first 8 lines of the image.

The Huffman tables, which are thus created in the optimum Huffman table creation section 560, are transferred to the Huffman coding section 541 and the Huffman coding section 553 of the L plane compression section 540 and the H plane compression section 550, respectively. The Huffman coding section 541 and the Huffman coding section 553 perform the Huffman coding in accordance with the received Huffman tables.

Figure 23:
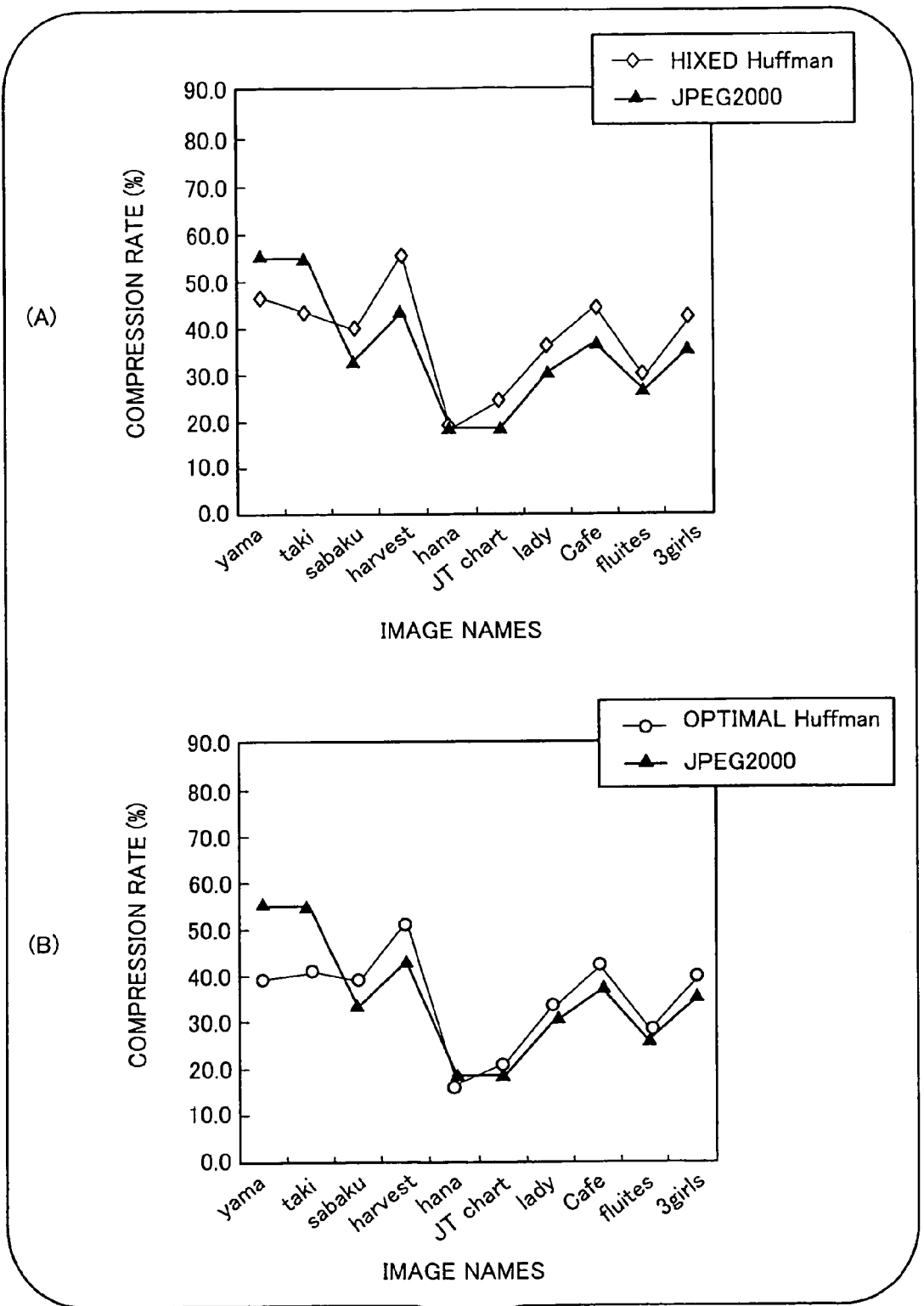
FIG. 23 is an explanatory view useful for understanding effects of data compression through an adoption of the optimized Huffman table.

FIG. 23 is an explanatory view useful for understanding effects of data compression through an adoption of the optimized Huffman table.

FIG. 23 shows compressibility for ten sorts of typical CT image of data. For the sake of comparison, there are also shown compressibility by JPEG 2000 of the reversible compression system, which is known as the compression system in which particularly high compressibility can be obtained in the conventional compression technology. A part (A) of FIG. 23 shows compressibility of data wherein the code trains shown in FIG. 21 are used on a fixing basis. A part (B) of FIG. 23 shows compressibility of data wherein the code trains suitable for every image data are used. The compressibility is expressed by rate in which the original data is 100%. A so-called "high compressibility" means that the numerical value of the compressibility is small.

As seen from the part (A) of FIG. 23, in the event that the code trains are used on a fixing basis, the compressibility of data are closed to the compressibility by the JPEG 2000, but remaining differences about 5% to 10%. To the contrary, in the event that the code trains suitable for every image data are used, as seen from the part (B) of FIG. 23, the compressibility of data are closed to the compressibility by the JPEG 2000 to the similar extent. Thus it is possible to implement high compressibility while it is concerned with the reversible compression.

According to the embodiments of the present invention, there are shown examples in which data compression is applied to only the data of the CT image. However, according to a data compression apparatus of the present invention, it is acceptable that data compression is applied to both the data of the CT image and the data of the LW image, and further it is acceptable that data compression is applied to data representative of information other than images.

According to the data compression apparatus of the present invention and the data compression program stored in the data compression program storage medium of the present invention, new data to be compressed, which is created by the differential creating section from the original data to be compressed and be subjected to the offset in numerical value by the offset section, is divided into upper significant data and lower significant data, so that the upper significant data compression section and the lower significant data compression section apply the reversal compression processing to the upper significant data and the lower significant data, respectively. Generally, in case of the new data to be compressed obtained from the CT data, the upper significant data is extremely different from the lower significant data in distribution tendency of numerical values of data, and thus there exist reversible compression processing suitable for respective data. The compression processing according to the present invention makes it possible to achieve the great compressibility in its entirety. As the reversible compression processing which is applied to respective data, algorithm is applicable to the simple processing. Accordingly, the compression processing according to the present invention takes short time. Thus, according to the data compression apparatus of the present invention and the data compression program stored in the data compression program storage medium of the present invention, an application of the present invention to the compression of the CT data makes it possible to implement particularly preferable new reversible compression processing.

In the event that the upper significant data compression section is provided with the first coding section, only the compression object numerical value is encoded into the compression object numerical value and the numerical value representative of the number of continuity. This feature makes it possible to avoid such a problem that redundancy is increased more than the original data, and thereby improving the compressibility.

In the event that the upper significant data compression section is provided with the second coding section, there is expected further improvement of the compressibility by the entropy coding (typically the Huffman coding).

In the event that the upper significant data compression section is provided with the histogram computing section and the coding allocation section, and the second coding section uses a table in which the code allocation section allots codes to apply an entropy coding (for example, Huffman coding), it is possible to more greatly improve the compressibility as compared with the entropy coding using a table fixed in allocation of codes.

In the event that the lower significant data compression section is one for applying the entropy coding, there is expected further improvement of the compressibility by the entropy coding (typically the Huffman coding).

The provision of the allocation section makes it possible to expect further improvement of the compressibility of the entropy coding by the lower significant data compression section.

In the event that the allocation section is one for determining the occurrence frequency through analysis of numerical values corresponding to a part of the image, it is possible to reduce the operation while maintaining accuracy of the occurrence frequency.

In the event that the allocation section is one for determining the occurrence frequency through analysis of the analyzing data, it is possible to suitably process the image in accordance with a table optimized in its entirety, even in a case where the image is processed on a partial basis.

In the event that the upper significant data compression section is also one for applying the entropy coding (typically the Huffman coding) to data, there is expected further improvement of the compressibility, when the allocation section creates the optimal table on the table for the upper significant data compression section.

In the event that the lower significant data compression section is one for receiving an instruction of compression omission to output the lower significant data with non-compression, it is possible to select a higher speed of compression processing in accordance with such an instruction.

In the event that the differential coding section is the two-dimensional difference creating section, it is possible to improve the effects of the division of data into the upper significant data and the lower significant data.

While the present invention has been described with reference to the particular illustrative embodiments, it is not to be restricted by those embodiments but only by the appended claims. It is to be appreciated that those skilled in the art can change or modify the embodiments without departing from the scope and sprit of the present invention.

What is claimed is:

1. A data compression apparatus that applies a data compression processing to data to be compressed, the data consisting of continued numerical values represented by a predetermined number of unit bits, the data compression apparatus comprising:
   a difference creating section that determines a difference between adjacent numerical values on continuity of numerical values constituting the data to be compressed so as to create new data to be compressed consisting of continued numerical values representative of the difference;
   an offset section wherein numerical values constituting the new data to be compressed consisting of the continued numerical values, which is created by the difference creating section, is subjected to an offset by a predetermined value;
   a divisional section that divides every numerical value of the data to be compressed, which is subjected to the offset by the offset section, into an upper significant digit bit portion and a lower significant digit bit portion at a predetermined divisional bit number less than the predetermined number of unit bits, so that the data to compressed is divided into upper significant digit data consisting of continuity of numerical values of the upper significant digit bit portion and lower significant digit data consisting of continuity of numerical values of lower significant digit bit portion;
   an upper significant data compression section that applies reversal compression processing to the upper significant digit data divided by the divisional section; and
   a lower significant data compression section that applies reversal compression processing to the lower significant digit data divided by the divisional section.

2. A data compression apparatus according to claim 1, wherein the upper significant data compression section includes a first coding section that outputs directly numerical values excepting a predetermined compression object numerical value of one or plural compression object numerical values, of the upper significant digit data, and outputs compression object numerical values through encoding into the compression object numerical values and numerical values representative of the continued number of the compression object numerical values identical with the compression object numerical values.

3. A data compression apparatus according to claim 1, wherein the upper significant data compression section comprises:
   a first coding section that outputs directly numerical values excepting a predetermined compression object numerical value of one or plural compression object numerical values, of the upper significant digit data, and outputs compression object numerical values through encoding into the compression object numerical values and numerical values representative of the continued number of the compression object numerical values identical with the compression object numerical values; and
   a second coding section that applies entropy coding to data subjected to encoding by the first coding section, using a table for associating codes with numerical values.

4. A data compression apparatus according to claim 1, wherein the upper significant data compression section comprises:
   a first coding section that outputs directly numerical values excepting a predetermined compression object numerical value of one or plural compression object numerical values, of the upper significant digit data, and outputs compression object numerical values through encoding into the compression object numerical values and numerical values representative of the continued number of the compression object numerical values identical with the compression object numerical values; and
   a second coding section that applies Huffman coding to data subjected to encoding by the first coding section, using a Huffman table.

5. A data compression apparatus according to claim 4, wherein the upper significant data compression section comprises:
   a first coding section that outputs directly numerical values excepting a predetermined compression object numerical value of one or plural compression object numerical values, of the upper significant digit data, and outputs compression object numerical values through encoding into the compression object numerical values and numerical values representative of the continued number of the compression object numerical values identical with the compression object numerical values;
   a histogram computing section that determines a histogram of numeral values appearing on the data subjected to encoding by the first coding section;

a code allocation section that allots to a table for associating codes with numerical values the shorter code in code length, as occurrence frequency is higher in numerical number, in accordance with the histogram determined in the histogram computing section; and a second coding section that applies entropy coding to data subjected to encoding by the first coding section, using a table in which codes are allotted in the code allocation section.

6. A data compression apparatus according to claim 1, wherein the lower significant data compression section applies entropy coding to the lower significant data, using a table for associating codes with numerical values.

7. A data compression apparatus according to claim 1, wherein the lower significant data compression section applies Huffman coding to the lower significant data, using a Huffman table.

8. A data compression apparatus according to claim 1, wherein the lower significant data compression section comprises:

an upper significant data compression section that applies reversible compression processing to the upper significant digit data divided by the divisional section, and applies reversible compression processing, including coding processing for applying entropy coding using a table for associating codes with numerical values, to the lower significant digit data divided by the divisional section; and an allocation section that allots to the table, prior to the reversible compression processing by the lower significant data compression section, the shorter code in code length, as occurrence frequency is higher in numerical number of the data to be compressed, to which entropy coding is applied.

9. A data compression apparatus according to claim 8, wherein the lower significant data compression section performs, as the coding processing, coding processing for applying Huffman coding, using a Huffman table, and the allocation section allots codes to the Huffman table of the lower significant data compression section.

10. A data compression apparatus according to claim 8, wherein the allocation section determines the occurrence frequency through analysis of numerical values corresponding to a part of an image, of compressed data representative of the image.

11. A data compression apparatus according to claim 8, wherein the allocation section creates analyzing data through applying same processing as that of the difference creating section, the offset section, and the divisional section to the numerical values corresponding to a part of an image, of compressed data representative of the image, and determines the occurrence frequency through analyzing the analyzing data.

12. A data compression apparatus according to claim 8, wherein the upper significant data compression section applies reversible compression processing, including coding processing for applying entropy coding using a table for associating codes with numerical values, to the upper significant digit data divided by the divisional section, the allocation section determines occurrence frequencies of numerical values on compressed data of the upper significant data compression section and the lower significant data compression section through analysis of numerical values corresponding to a part of an image, of the compressed data representative of the image, and the allocation section allots to the table of each of the upper significant data compression section and the lower significant data compression section the shorter code in code length, as occurrence frequency is higher in numerical number of the data to be compressed, in accordance with the occurrence frequencies.

13. A data compression apparatus according to claim 8, wherein the upper significant data compression section applies reversible compression processing, including coding processing for applying entropy coding using a table for associating codes with numerical values, to the upper significant digit data divided by the divisional section, the allocation section creates analyzing data through applying same processing as that of the difference creating section, the offset section, and the divisional section to the numerical values corresponding to a part of an image, of compressed data representative of the image, and determines occurrence frequencies of numerical values on compressed data of the upper significant data compression section and the lower significant data compression section through analyzing the analyzing data, and the allocation section allots to the table of each of the upper significant data compression section and the lower significant data compression section the shorter code in code length, as occurrence frequency is higher in numerical number of the data to be compressed, in accordance with the occurrence frequencies.

14. A data compression apparatus according to claim 12, wherein the upper significant data compression section performs, as the coding processing, coding processing for applying Huffman coding, using a Huffman table, and the allocation section allots codes to the Huffman table of the upper significant data compression section.

15. A data compression apparatus according to claim 13, wherein the upper significant data compression section performs, as the coding processing, coding processing for applying Huffman coding, using a Huffman table, and the allocation section allots codes to the Huffman table of the upper significant data compression section.

16. A data compression apparatus according to claim 1, wherein the lower significant data compression section receives an instruction of compression omission to output the lower significant data with non-compression.

17. A data compression apparatus according to claim 1, wherein the data compression apparatus further comprises a two-dimensional creating section that determines a two-dimensional difference on numerical values constituting compressed data in accordance with a plurality of numerical values adjacent to the numerical values in a plurality of directions looking on the image so that there is created image data consisting of continuity of numerical values representative of the two-dimensional difference.

18. A data compression program storage on computer readable medium for storing a data compression program and the program is executed by a computer, which causes an information processing apparatus to operate as a data compression apparatus that applies a data compression processing to data to be compressed, the data consisting of continued numerical values represented by a predetermined number of unit bits, the data compression apparatus comprising:

a difference creating section that determines a difference between adjacent numerical values on continuity of numerical values constituting the data to be compressed so as to create new data to be compressed consisting of continued numerical values representative of the difference;

an offset section wherein numerical values constituting the new data to be compressed consisting of the continued numerical values, which is created by the difference creating section, is subjected to an offset by a predetermined value;

a divisional section that divides every numerical value of the data to be compressed, which is subjected to the offset by the offset section, into an upper significant digit bit portion and a lower significant digit bit portion at a predetermined divisional bit number less than the predetermined number of unit bits, so that the data to be compressed is divided into upper significant digit data consisting of continuity of numerical values of the upper significant digit bit portion and lower significant digit data consisting of continuity of numerical values of lower significant digit bit portion;

an upper significant data compression section that applies reversal compression processing to the upper significant digit data divided by the divisional section; and a lower significant data compression section that applies reversal compression processing to the lower significant digit data divided by the divisional section.

* * * * *